(12) United States Patent
Li et al.

(10) Patent No.: US 11,864,420 B2
(45) Date of Patent: Jan. 2, 2024

(54) DISPLAY PANEL WITH ANODE ELECTRODE COMPRISING FIRST TRANSPARENT CONDUCTIVE LAYER AND METAL LAYER, AND MANUFACTURING METHOD THEREOF, AND DISPLAY APPARATUS

(71) Applicant: BOE TECHNOLOGY GROUP CO., LTD., Beijing (CN)

(72) Inventors: Dongsheng Li, Beijing (CN); Xiaochuan Chen, Beijing (CN); Shengji Yang, Beijing (CN); Kuanta Huang, Beijing (CN); Hui Wang, Beijing (CN); Xiaodan Zhang, Beijing (CN); Yanming Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 800 days.

(21) Appl. No.: 16/958,284

(22) PCT Filed: Aug. 23, 2019

(86) PCT No.: PCT/CN2019/102345
§ 371 (c)(1),
(2) Date: Jun. 26, 2020

(87) PCT Pub. No.: WO2021/035442
PCT Pub. Date: Mar. 4, 2021

(65) Prior Publication Data
US 2022/0376013 A1  Nov. 24, 2022

(51) Int. Cl.
*H01L 29/08* (2006.01)
*H10K 59/121* (2023.01)
(Continued)

(52) U.S. Cl.
CPC ....... *H10K 59/1213* (2023.02); *H10K 50/856* (2023.02); *H10K 59/1216* (2023.02); *H10K 2102/102* (2023.02); *H10K 2102/103* (2023.02)

(58) Field of Classification Search
CPC .......... H10K 59/1213; H10K 59/1216; H10K 50/856; H10K 2102/102; H10K 2102/103
(Continued)

(56) References Cited

U.S. PATENT DOCUMENTS 9,349,780 B2  5/2016 Kim et al.
9,685,489 B2  6/2017 Shi et al.
(Continued)

FOREIGN PATENT DOCUMENTS

CN  102456841 A  * 5/2012  ......... H01L 27/3209
CN  103500752 A    1/2014
(Continued)

OTHER PUBLICATIONS

First Indian Office Action in Indian Application No. 202047056447 dated Mar. 31, 2022 with English translation.
(Continued)

*Primary Examiner* — Phuc T Dang
(74) *Attorney, Agent, or Firm* — Collard & Roe, P.C.

(57) ABSTRACT

A display panel and a manufacturing method thereof, and a display apparatus are provided. The display panel includes: a base substrate, a plurality of pixels, and a drive circuit. At least one of the pixels includes a light-emitting device; the light-emitting device includes an anode electrode and a light-emitting layer; the anode electrode includes a first transparent conductive layer and a metal layer, the first transparent conductive layer completely covers the metal layer, and an orthographic projection of the metal layer on the base substrate is located in an orthographic projection of
(Continued)

the first transparent conductive layer on the base substrate; the light-emitting layer is stacked with the anode electrode and is located on a side of the first transparent conductive layer facing away from the metal layer; the drive circuit is located between the base substrate and the anode electrode.

20 Claims, 11 Drawing Sheets

(51) Int. Cl.
*H10K 50/856* (2023.01)
*H10K 102/10* (2023.01)

(58) Field of Classification Search
USPC .......................................................... 257/40
See application file for complete search history.

(56) References Cited

U.S. PATENT DOCUMENTS

| | | | |
|---|---|---|---|
| 2008/0111484 A1 | 5/2008 | Kwon et al. | |
| 2009/0179560 A1* | 7/2009 | Chun | H10K 59/122 |
| | | | 313/504 |
| 2013/0140543 A1* | 6/2013 | Harada | H10K 50/17 |
| | | | 257/40 |
| 2014/0284576 A1* | 9/2014 | Sugisawa | H10K 50/852 |
| | | | 257/40 |
| 2015/0090993 A1* | 4/2015 | Tokuda | H10K 50/00 |
| | | | 438/23 |
| 2016/0020422 A1 | 1/2016 | Kim et al. | |
| 2019/0229169 A1 | 7/2019 | Huang et al. | |

FOREIGN PATENT DOCUMENTS

| | | | | |
|---|---|---|---|---|
| CN | 104466025 A | | 3/2015 | |
| CN | 104885250 A | | 9/2015 | |
| CN | 107437930 A | | 12/2017 | |
| CN | 107528008 A | * | 12/2017 | ............. H01L 27/32 |
| CN | 109524445 A | | 3/2019 | |
| KR | 20170123847 A | * | 11/2017 | ............ H01L 33/005 |
| KR | 20190064991 A | * | 6/2019 | ......... H01L 51/5243 |

OTHER PUBLICATIONS

First Chinese Office Action in Chinese Application No. 201980001445.2 dated Apr. 19, 2022 with English translation.
International Search Report of PCT/CN2019/102345 in Chinese, dated May 22, 2020 with English Translation.
International Search Report of PCT/CN2019/102345 in Chinese, dated May 22, 2020.
Notice of Transmittal of the International Search Report of PCT/CN2019/102345 in Chinese, dated May 22, 2020.
Written Opinion of the International Searching Authority of PCT/CN2019/102345 in Chinese, dated May 22, 2020.

* cited by examiner

DISPLAY PANEL WITH ANODE ELECTRODE COMPRISING FIRST TRANSPARENT CONDUCTIVE LAYER AND METAL LAYER, AND MANUFACTURING METHOD THEREOF, AND DISPLAY APPARATUS

CROSS REFERENCE TO RELATED APPLICATIONS

This application is the National Stage of PCT/CN2019/102345 filed on Aug. 23, 2019, the disclosure of which is incorporated by reference.

TECHNICAL FIELD

At least one embodiment of the present disclosure provides a display panel and a manufacturing method thereof, and a display apparatus.

BACKGROUND

In fields of OLED display and Micro OLED display, sometimes a higher brightness of an organic light-emitting device is required. The structure of an anode electrode has a great influence on the brightness of the light emitted by an organic light-emitting layer of the organic light-emitting device. A lower work function of the anode electrode is not conducive to the injection of holes from the anode electrode, and the reflectivity of the anode electrode affects the amount of the light finally emitted from the organic light-emitting device, thus affecting the brightness of the organic light-emitting device.

SUMMARY

At least one embodiment of the present disclosure provides a display panel, and the display panel includes: a base substrate, a plurality of pixels, an anode electrode, a light-emitting layer, and a drive circuit; the plurality of pixels located at a side of the base substrate; at least one of the plurality of pixels includes the anode electrode and the light-emitting layer; the anode electrode includes a first transparent conductive layer and a metal layer which are stacked; the first transparent conductive layer is located on a side of the metal layer facing away from the base substrate, the first transparent conductive layer completely covers the metal layer, and an orthographic projection of the metal layer on the base substrate is located in an orthographic projection of the first transparent conductive layer on the base substrate; the light-emitting layer is stacked with the anode electrode and is located on a side of the first transparent conductive layer facing away from the metal layer; the drive circuit located between the base substrate and the light-emitting layer; the drive circuit includes a drive transistor and a storage capacitor, the drive transistor includes a source electrode, a drain electrode and a gate electrode, one of the source electrode and the drain electrode is electrically connected with the anode electrode, the gate electrode is electrically connected with the storage capacitor, and the storage capacitor is configured to store data signals.

For example, in the display panel provided by at least one embodiment of the present disclosure, the anode electrode further includes: a second transparent conductive layer, stacked with the first transparent conductive layer and the metal layer and positioned between the metal layer and the drive circuit; the first transparent conductive layer and the second transparent conductive layer completely encapsulate the metal layer, and the orthographic projection of the metal layer on the base substrate is located in an orthographic projection of the second transparent conductive layer on the base substrate.

For example, in the display panel provided by at least one embodiment of the present disclosure, the second transparent conductive layer includes a first surface facing the base substrate, a second surface opposite to the first surface and located on a side of the first surface facing away from the base substrate, and a side surface intersecting with both the first surface and the second surface; and the first transparent conductive layer covers the side surface of the second transparent conductive layer and a portion of the second surface of the second transparent conductive layer that is not covered by the metal layer.

For example, in the display panel provided by at least one embodiment of the present disclosure, the orthographic projection of the first transparent conductive layer on the base substrate completely coincides with the orthographic projection of the second transparent conductive layer on the base substrate.

For example, in the display panel provided by at least one embodiment of the present disclosure, the base substrate includes a main surface, the second transparent conductive layer, the first transparent conductive layer, and the metal layer are stacked on the main surface of the base substrate, and an included angle between the side surface of the second transparent conductive layer and the main surface of the base substrate is ranged from 30 to 60 degrees.

For example, in the display panel provided by at least one embodiment of the present disclosure, the base substrate includes a main surface, the first transparent conductive layer and the metal layer are stacked on the main surface of the base substrate, and the first transparent conductive layer is located on a side of the metal layer facing away from the base substrate; the metal layer includes a first surface facing the base substrate, a second surface opposite to the first surface and located on a side of the first surface facing away from the base substrate, and a side surface intersecting with both the first surface and the second surface; and the first transparent conductive layer covers the second surface of the metal layer and the side surface of the metal layer.

For example, in the display panel provided by at least one embodiment of the present disclosure, the first transparent conductive layer includes a first surface facing the base substrate, a second surface opposite to the first surface and located on a side of the first surface facing away from the base substrate, and a side surface intersecting with the first surface or the second surface; and an included angle between the side surface of the first transparent conductive layer and the main surface of the base substrate is smaller than an included angle between the side surface of the metal layer and the main surface of the base substrate.

For example, in the display panel provided by at least one embodiment of the present disclosure, the included angle between the side surface of the first transparent conductive layer and the main surface of the base substrate is ranged from 20 to 50 degrees, and the included angle between the side surface of the metal layer and the main surface of the base substrate is ranged from 30 to 60 degrees.

For example, in the display panel provided by at least one embodiment of the present disclosure, a work function of the first transparent conductive layer is greater than a work function of the metal layer.

For example, in the display panel provided by at least one embodiment of the present disclosure, a work function of a material of the first transparent conductive layer is greater than 4.60 eV.

For example, in the display panel provided by at least one embodiment of the present disclosure, each of a material of the first transparent conductive layer and a material of the second transparent conductive layer includes at least one of indium tin oxide (ITO), indium zinc oxide (IZO) and aluminum-doped zinc oxide (AZO).

For example, in the display panel provided by at least one embodiment of the present disclosure, a reflectivity of the metal layer is greater than a reflectivity of the first transparent conductive layer.

For example, in the display panel provided by at least one embodiment of the present disclosure, a reflectivity of the metal layer is greater than or equal to 90%.

For example, in the display panel provided by at least one embodiment of the present disclosure, a material of the metal layer is silver.

For example, in the display panel provided by at least one embodiment of the present disclosure, a thickness of the metal layer is greater than a thickness of the first transparent conductive layer, and the thickness of the metal layer is greater than a thickness of the second transparent conductive layer.

For example, the display panel provided by at least one embodiment of the present disclosure includes: a plurality of anode electrodes spaced from each other; and a cathode electrode, located at a side of the light-emitting layer facing away from the plurality of anode electrodes; the light-emitting layer is a continuous integral layer and covers the second surface of the first transparent electrode layer of each of the plurality of anode electrodes and the side surface of the first transparent electrode layer of each of the plurality of anode electrodes.

For example, in the display panel provided by at least one embodiment of the present disclosure, the display panel is a Micro LED display panel or an OLED display panel.

For example, the display panel provided by at least one embodiment of the present disclosure further includes a light-reflecting layer, located between the base substrate and the anode electrode and electrically connected with the anode electrode.

For example, the display panel provided by at least one embodiment of the present disclosure further includes a first insulation layer located between the anode electrode and the light-reflecting layer and including a first via hole; the anode electrode is electrically connected with the light-reflecting layer through the first via hole.

For example, the display panel provided by at least one embodiment of the present disclosure further includes a second insulation layer located between the light-reflecting layer and the source electrode and the drain electrode and including a second via hole; the one of the source electrode and the drain electrode is electrically connected with the light-reflecting layer through the second via hole.

At least one embodiment of the present disclosure provides a display apparatus, and the display apparatus includes any one of the display panels provided by embodiments of the present disclosure.

At least one embodiment of the present disclosure provides a manufacturing method of a display panel, the manufacturing method includes: providing a base substrate; forming a plurality of pixels at a side of the base substrate, in which at least one of the plurality of pixels includes an anode electrode and a light-emitting layer, the anode electrode includes a first transparent conductive layer and a metal layer which are stacked, the first transparent conductive layer is located on a side of the metal layer facing away from the base substrate, the first transparent conductive layer completely covers the metal layer, and an orthographic projection of the metal layer on the base substrate is located in an orthographic projection of the first transparent conductive layer on the base substrate, and the light-emitting layer is stacked with the anode electrode and located on a side of the first transparent conductive layer facing away from the metal layer; and forming a drive circuit, in which the drive circuit is located between the base substrate and the anode electrode and includes a drive transistor and a storage capacitor, the drive transistor includes a source electrode, a drain electrode, and a gate electrode, one of the source electrode and the drain electrode is electrically connected with the anode electrode, the gate electrode is electrically connected with the storage capacitor, and the storage capacitor is configured to store data signals.

For example, in the manufacturing method provided by at least one embodiment of the present disclosure, forming the anode electrode includes: forming a first mask on the base substrate, in which the first mask includes a first opening and a second opening stacked in a direction perpendicular to the base substrate and communicating with each other, an orthographic projection of the first opening on the base substrate is located in an orthographic projection of the second opening on the base substrate, and the first opening is located on a side of the second opening facing away from the base substrate; and forming the first transparent conductive layer and the metal layer by using the first mask.

For example, in the manufacturing method provided by at least one embodiment of the present disclosure, the metal layer includes a first surface facing the base substrate, a second surface opposite to the first surface, and a side surface intersecting with both the first surface and the second surface; the first opening includes a normal line passing through a center of the first opening and perpendicular to the base substrate; the forming the first transparent conductive layer and the metal layer by using the first mask includes: arranging a metal material source at a side of the first opening facing away from the base substrate, and forming the metal layer by vapor deposition using the metal material source, in which a metal material from the metal material source passes through the first opening and the second opening to reach a first position on the base substrate farthest from the normal line, and a first included angle is formed between a connection line of the first position and the metal material source and the base substrate; and arranging a first transparent conductive material source at the side of the first opening facing away from the base substrate, and forming the first transparent conductive layer by vapor deposition using the first transparent conductive material source, in which a transparent conductive material from the first transparent conductive material source passes through the first opening and the second opening to reach a second position on the base substrate farthest from the normal line, and a second included angle is formed between a connection line of the second position and the first transparent conductive material source and the base substrate; and the second included angle is smaller than the first included angle, and the base substrate rotates around the normal line or an axial line parallel to the normal line during forming the metal layer by vapor deposition and forming the first transparent conductive layer by vapor deposition, so that the first transparent conductive layer covers the second surface of the metal layer and the side surface of the metal layer.

For example, in the manufacturing method provided by at least one embodiment of the present disclosure, the metal material source is located at the normal line of the first opening, or in a direction parallel to the base substrate, the metal material source is spaced apart from the normal line by a first distance; in the direction perpendicular to the base substrate, a distance between the metal material source and the base substrate is a first height; in the direction parallel to the base substrate, the first transparent conductive material source is spaced apart from the normal line by a second distance; in the direction perpendicular to the base substrate, a distance between the first transparent conductive material source and the base substrate is a second height; and the second distance is greater than the first distance, and the second height is equal to the first height.

For example, in the manufacturing method provided by at least one embodiment of the present disclosure, a second transparent conductive layer is formed on the base substrate by using the first mask, the second transparent conductive layer is stacked with the first transparent conductive layer and the metal layer in the direction perpendicular to the base substrate and is positioned between the metal layer and the drive circuit, the first transparent conductive layer and the second transparent conductive layer completely encapsulate the metal layer, and the orthographic projection of the metal layer on the base substrate is located in an orthographic projection of the second transparent conductive layer on the base substrate; the forming the second transparent conductive layer on the base substrate by using the first mask includes: arranging a second transparent conductive material source on the side of the first opening facing away from the base substrate, and forming the second transparent conductive layer by vapor deposition using the second transparent conductive material source; in the direction parallel to the base substrate, the second transparent conductive material source is spaced apart from the normal line by a third distance; in the direction perpendicular to the base substrate, a distance between the second transparent conductive material source and the base substrate is a third height; and the third distance is greater than the first distance and smaller than the second distance, and the third height is equal to the first height.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
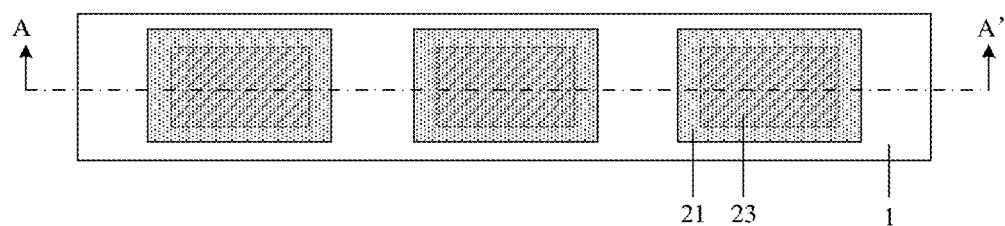
FIG. 1A is a schematic structural plan view of three pixels of a display panel according to embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Similarly, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

It should be noted that the included angle between the side surface of the first transparent conductive layer and the main surface of the base substrate in the embodiments of the present disclosure refers to the acute angle therebetween, and the included angle between the side surface of the metal layer and the main surface of the base substrate refers to the acute angle therebetween.

It should be noted that, in the embodiments of the present disclosure, if the planar shape of the first opening is a regular shape, the center of the first opening refers to the geometric center of the regular shape. For example, the planar shape of the first opening is circle, and then the center of the first opening refers to the center of the circle. For example, the plane shape of the first opening is rectangle, and then the center of the first opening refers to the intersection point of diagonal lines of the rectangle. If the planar shape of the first opening is an irregular shape, the center of the first opening refers to a certain position in the central region of the irregular shape. The center of the second opening has the same meaning as the center of the first opening.

For example, in a light-emitting element, an anode electrode comprises a first chromium metal layer, an aluminum metal layer, a second chromium metal layer, and a molybdenum metal layer stacked in the order of the first chromium metal layer, the aluminum metal layer, the second chromium metal layer, and the molybdenum metal layer (i.e. Cr/Al/Cr/Mo). The aluminum metal layer has a high reflectivity. The first chromium metal layer, the second chromium metal layer, and the molybdenum metal layer protect the aluminum metal layer but affect the reflectivity of the anode electrode, thereby reducing the light extraction efficiency of the light-emitting device.

At least one embodiment of the present disclosure provides a light-emitting device, the light-emitting device includes: an anode electrode and a light-emitting layer. The anode electrode includes a first transparent conductive layer and a metal layer which are stacked. The light-emitting layer and the anode electrode are stacked and the light-emitting layer is positioned at a side of the first transparent conductive layer facing away from the metal layer. The work function of the first transparent conductive layer is greater than the work function of the metal layer, and the reflectivity of the metal layer is greater than the reflectivity of the first transparent conductive layer.

At least one embodiment of the present disclosure provides a display panel, and the display panel includes: a base substrate, a plurality of pixels, and a drive circuit; the plurality of pixels located at a side of the base substrate, and at least one of the plurality of pixels includes a light-emitting device; the light-emitting device includes an anode electrode and a light-emitting layer; the anode electrode includes a first transparent conductive layer and a metal layer which are stacked, the first transparent conductive layer is located on a side of the metal layer facing away from the base substrate, the first transparent conductive layer completely covers the metal layer, and an orthographic projection of the metal layer on the base substrate is located in an orthographic projection of the first transparent conductive layer on the base substrate; and the light-emitting layer is stacked with the anode electrode and is located on a side of the first transparent conductive layer facing away from the metal layer, the work function of the first transparent conductive layer is greater than the work function of the metal layer, and the reflectivity of the metal layer is greater than the reflectivity of the first transparent conductive layer; the drive circuit is located between the base substrate and the anode electrode; the drive circuit includes a drive transistor and a storage capacitor, the drive transistor includes a source electrode, a drain electrode and a gate electrode, one of the source electrode and the drain electrode is electrically connected with the anode electrode, the gate electrode is electrically connected with the storage capacitor, and the storage capacitor is configured to store data signals.

It should be noted that, in the embodiments of the present disclosure, the anode electrode refers to the electrode of the light-emitting device connected to a positive pole of an applied drive voltage, and holes move from the anode electrode toward the light-emitting layer of the light-emitting device under the driving of the applied drive voltage. The cathode electrode refers to the electrode of the light-emitting device connected to the negative pole of the applied drive voltage. Electrons move from the cathode electrode to the light-emitting layer of the light-emitting device under the driving of the applied drive voltage, and then recombine with the holes from the anode electrode in the light-emitting layer so that the light-emitting layer emits light.

Figure 1B:
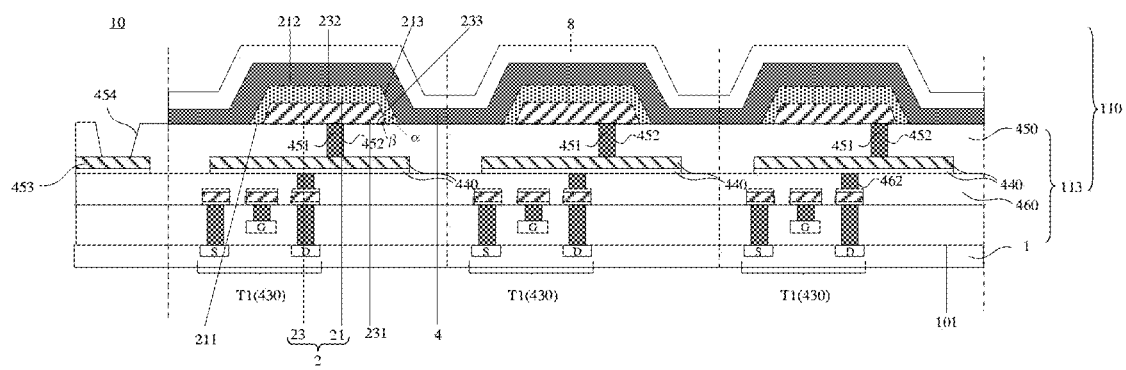
FIG. 1B is a schematic cross-sectional view taken along the line A-A' in FIG. 1A.

Illustratively, FIG. 1A is a schematic structural plan view of three pixels of the display panel according to the embodiments of the present disclosure; FIG. 1B is a schematic cross-sectional view taken along line A-A' in FIG. A. As shown in FIG. 1A and FIG. 1B, the display panel 10 includes an array substrate 110. The array substrate 110 includes a base substrate 1 and a light-emitting device located on the base substrate 1. The light-emitting device includes an anode electrode 2, a light-emitting layer 4, and a cathode electrode 8. The anode electrode 2 includes a first transparent conductive layer 21 and a metal layer 23 which are stacked, and the first transparent conductive layer 21 is located on a side of the metal layer 23 facing away from the base substrate 1. The light-emitting layer 4 is stacked with the anode electrode 2 and is located on a side of the first transparent conductive layer 21 facing away from the metal layer 23. For example, the light-emitting layer 4 is in direct contact with the first transparent conductive layer 21, and the first transparent conductive layer 21 is in direct contact with the metal layer 23, that is, there is no other layer or structure between the light-emitting layer 4 and the first transparent conductive layer 21, and there is no other layer or structure between the first transparent conductive layer 21 and the metal layer 23. The cathode electrode 8 is located on a side of the light-emitting layer 4 facing away from the anode electrode 2. For example, the display panel 10 includes the base substrate 1, the base substrate 1 has a main surface 101, and the anode electrode 2, the light-emitting layer 4, and the cathode electrode 8 are arranged on the main surface. The light-emitting layer 4 and the anode electrode 2 are stacked in a direction perpendicular to the main surface 101 of the base substrate 1, the first transparent conductive layer 21 and the metal layer 23 are stacked in the direction perpendicular to the main surface 101 of the base substrate 1, and the first transparent conductive layer 21 is located on the side of the metal layer 23 facing away from the main surface 101 of the base substrate 1. The work function of the first transparent conductive layer 21 is greater than the work function of the metal layer 23, and the reflectivity of the metal layer 23 is greater than the reflectivity of the first transparent conductive layer 21. In the light-emitting device, light emitted from the light-emitting layer 4 is reflected by the anode electrode 2 and then is emitted through the cathode electrode to realize display. On one hand, the work function of the transparent conductive layer 21 is greater than the work function of the metal layer 23, which is beneficial to improve the hole injection capability into the light-emitting layer, so that the intensity of the light emitted by the light-emitting layer is high. On the other hand, the metal layer 23 has a higher reflectivity, which is beneficial to improve the light extraction efficiency. Therefore, the brightness of the display panel 10 is large.

Figure 1C:
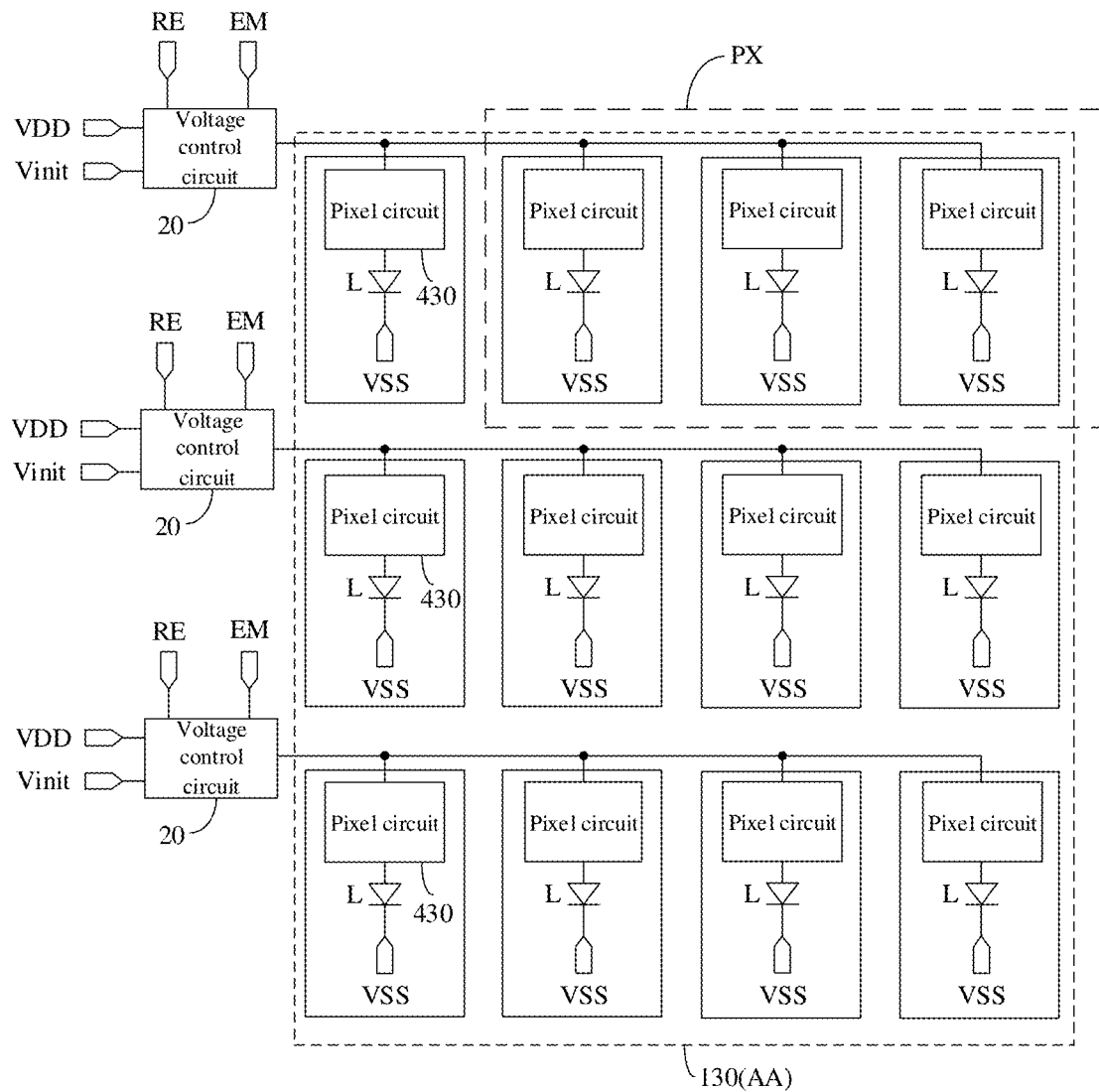
FIG. 1C is a schematic circuit diagram of the display panel according to the embodiments of the present disclosure.

For example, the drive circuit includes a voltage control circuit and a pixel circuit. FIG. 1C is a schematic circuit diagram of the display panel according to the embodiments of the present disclosure. Referring to FIG. 1B and FIG. 1C, the display panel includes an array substrate 110. The array substrate 110 includes the base substrate 1 and the pixel circuit 430 located on the base substrate 1. The pixel circuit 430 is located between the base substrate 1 and the anode electrode 2 and includes a drive transistor T1 and a storage capacitor Cst. The drive transistor T1 includes a gate electrode G, a first electrode, and a second electrode, one of the first electrode and the second electrode is electrically connected with the anode electrode 2, the gate electrode G is electrically connected with the storage capacitor Cst, and the storage capacitor Cst is configured to store data signals. For example, in FIG. 1B, the first electrode as a drain electrode D and the second electrode as a source electrode S are taken as examples. The first electrode and the second electrode may be interchanged. In other embodiments, the first electrode as the source electrode S and the second electrode as the drain electrode D are taken as another example.

As shown in FIG. 1B, for example, the array substrate 110 includes a silicon substrate 113, for example, the silicon substrate 113 includes the base substrate 1, and the pixel circuit 430, a light-reflecting layer 440, and a first insulation layer 450 which are sequentially stacked on the main surface 101 of the base substrate 1. For example, the anode electrode 2, the light-emitting layer 4, and the cathode electrode 8 are disposed on the first insulation layer 450, that is, the anode electrode 2, the light-emitting layer 4, and the cathode electrode 8 are arranged on a side of the first insulation layer 450 facing away from the main surface 101 of the base substrate 1. The light-reflecting layer 440 is located between the base substrate 1 and the anode electrode 2, is configured to reflect light from the light-emitting 4 layer, and is electrically connected with the anode electrode 2. For example, the first insulation layer 450 is transparent so that the light emitted from the light-emitting layer 4 passes through the first insulation layer 450, reaches the light-reflecting layer 440 and is reflected by the light-reflecting layer 440.

For example, the first insulation layer 450 is located between the anode electrode 2 and the light-reflecting layer 440 and includes a first via hole 452. The first via hole 452 is filled with a metal member 451, and the light-reflecting layer 440 is electrically connected with the anode electrode 2 through the first via hole 452 and the metal member 451. For example, the light-reflecting layer 440 is electrically connected with the metal layer 23 of the anode electrode 2 through the first via 452. That is, the metal member 451 respectively contacts the light-reflecting layer 440 and the metal layer 23 of the anode electrode 2 to electrically connect the light-reflecting layer 440 and the metal layer 23. The light-reflecting layer 440 is electrically connected with one of the source electrode S and the drain electrode D of the drive transistor T1, so that one of the source electrode S and the drain electrode D of the drive transistor T1 is electrically connected with the anode electrode 2. In this way, by forming a conductive path in the first insulation layer 450 between the light-reflecting layer 440 and the anode electrode 2, the electrical signal provided by the pixel circuit 430 in the silicon substrate is transmitted to the anode electrode 2 through the light-reflecting layer 440, thereby improving the light extraction efficiency.

For example, the display panel 10 further includes a second insulation layer 460, and the second insulation layer 460 is located between the light-reflecting layer 440 and the source electrode S and the drain electrode D and includes a second via hole 462. One of the source electrode S and the drain electrode D is electrically connected with the light-reflecting layer 440 through the second via hole 462, thereby electrically connecting one of the source electrode S and the drain electrode D with the anode electrode 2.

Of course, in other embodiments, the light-reflecting layer 440 may not be provided, and the anode electrode 2 is directly electrically connected with one of the source electrode S and the drain electrode D of the drive transistor T1 through the first via hole 452. In this way, not only the control of the light-emitting device by the pixel circuit 430 is facilitated, but also the structure of the display apparatus is more compact, which is beneficial for the miniaturization of various devices of the display panel.

For example, the metal member 451 is made of metal material, such as tungsten metal, and the via hole filled with the tungsten metal is also referred to as a tungsten via hole (W-via). For example, in the case that the thickness of the first insulation layer 450 is large, forming the tungsten via hole in the first insulation layer 450 ensures the stability of the conductive path. Moreover, because the process of forming the tungsten via hole is mature, the obtained first insulation layer 450 has good surface flatness, which is beneficial to increase the bond strength between the first insulation layer 450 and the anode electrode 2. It can be understood that, the tungsten via hole is not only suitable for realizing the electrical connection between the first insulation layer 450 and the anode electrode 2, but also is suitable for the electrical connection between the light-reflecting layer 440 and the pixel circuit 430, as well as the electrical connection between other wire layers.

For example, the silicon substrate 113 includes the pixel circuit 430, and the pixel circuit 430 is electrically connected with the light-reflecting layer 440 so that the pixel circuit 430 is configured to drive the light-emitting device to emit light. The pixel circuit 430 includes at least the drive transistor T1 and a switch transistor (not shown), and the drive transistor T1 and the light-reflecting layer 440 are electrically connected with each other. Thus, the electrical signals for driving the light-emitting device is transmitted to the anode electrode 2 through the light-reflecting layer 440, thereby controlling the light-emitting device to emit light. For example, the drive transistor T1 includes the gate electrode G, the source electrode S, and the drain electrode D. For example, the drain electrode D of the drive transistor T1 is electrically connected with the light-reflecting layer 440. If the drive transistor T1 is in a turning-on state, the electric signals supplied from a power supply line is transmitted to the anode electrode 2 through the drain electrode D of the drive transistor T1 and the light-reflecting layer 440. Because a voltage difference is generated between the anode electrode 2 and the cathode electrode 8, an electric field is formed between the anode electrode 2 and the cathode electrode 8, and the organic light-emitting layer 4 emits light under the action of the electric field. It can be understood that, in the drive transistor T1, the positions of the source electrode S and the drain electrode D are interchangeable, so that one of the source electrode S and the drain electrode D is electrically connected with the light-reflecting layer 440.

The manufacturing precision of the silicon substrate 113 is high, which is beneficial to form the display panel having the silicon substrate 113, and thus is suitable for manufacturing a Micro-OLED display panel or a Mini-OLED display panel.

For example, the display panel 10 includes a plurality of pixels, and three pixels are illustratively shown in FIG. 1, for example, the three pixels are respectively a red pixel, a green pixel, and a blue pixel. Each of the three pixels corresponds to a pixel region of the array substrate 110. For example, an independent light-emitting device and an independent drive transistor T1 are provided in each of the three pixels.

For example, the first insulation layer 450 is integrally formed in the three pixels to facilitate the manufacturing process. For example, the display panel 10 further includes a pad 453, and the pad 453 is configured for bonding with a flexible printed circuit (FPC) board or bonding with a wire. As shown in FIG. 1B, the first insulation layer 450 further includes an opening 454 exposing the pad 453, and the opening 454 is provided for achieving electrical connection and signal communication between the pad 453 and an external circuit. The colors of pixels in the display apparatus are only exemplary and may include other colors such as yellow, white, etc.

As shown in FIG. 1C, the array substrate 110 includes a plurality of light-emitting devices L located in a display region 130 (AA region) and a plurality of pixel circuits 430 coupled to the plurality of light-emitting devices L in one-to-one correspondence, and each of the plurality of pixel circuits 430 includes the drive transistor. Further, the drive circuit further includes a plurality of voltage control circuits 20 located in a non-display region (a region other than the display region 130 in the array substrate) of the array substrate. For example, at least two of the plurality of pixel circuits 430 in a row share one of the plurality of voltage control circuit 20, and the first electrode of the drive transistor in a row of pixel circuits 430 is coupled to the shared voltage control circuit 20, and the second electrode of the drive transistor is coupled to a corresponding light-emitting device L. The voltage control circuit 20 is configured to output an initialization signal Vinit to the first electrode of the drive transistor in response to a reset control signal RE to control the reset of the corresponding light-emitting device L, and is configured to output a first power supply signal VDD to the first electrode of the drive transistor in response to a light emission control signal EM to drive the light-emitting device L to emit light. By sharing the voltage control circuit 20, the structure of each of the plurality of pixel circuits in the display region 130 is simplified, and the occupied area of the plurality of pixel circuits in the display region 130 is reduced, so that the display region 130 can be provided with more pixel circuits and light-emitting devices, and the organic light-emitting display panel with high PPI can be realized. In addition, each of the plurality of voltage control circuits 20 outputs the initialization signal Vinit to the first electrode of the drive transistor under the control of the reset control signal RE to control the reset of the corresponding light-emitting device, thereby avoiding the influence of the voltage loaded on the light-emitting device during the light emission of the previous frame on the light emission of the next frame, and further reducing the afterimage phenomenon.

For example, the array substrate includes a plurality of pixel units PX located in the display region 130, and each of the plurality of pixel units PX includes a plurality of pixels. Each of the plurality of pixels includes one light-emitting device L and one pixel circuit 430. Further, each of the plurality of pixel units PX includes three pixels of different colors. The three pixels for example are the red pixel, the green pixel, and the blue pixel. Of course, each of the plurality pixel units PX may include four pixels, five pixels, or more pixels, which are designed and determined according to the actual application environment, and are not limited here.

For example, the pixel circuits 430 in at least two adjacent pixels in the same row share one of the plurality of voltage control circuits 20. For example, in some examples, as shown in FIG. 1C, all of the pixel circuits 430 in the same row share one of the plurality of voltage control circuits 20. Alternatively, in other examples, the pixel circuits 430 in two adjacent pixels, three adjacent pixels, or more adjacent pixels in the same row share one of the plurality of voltage control circuits 20, which is not limited here. In this way, the occupied area of the plurality of pixel circuits in the display region 130 is reduced by sharing the voltage control circuits 20.

Figure 1D:
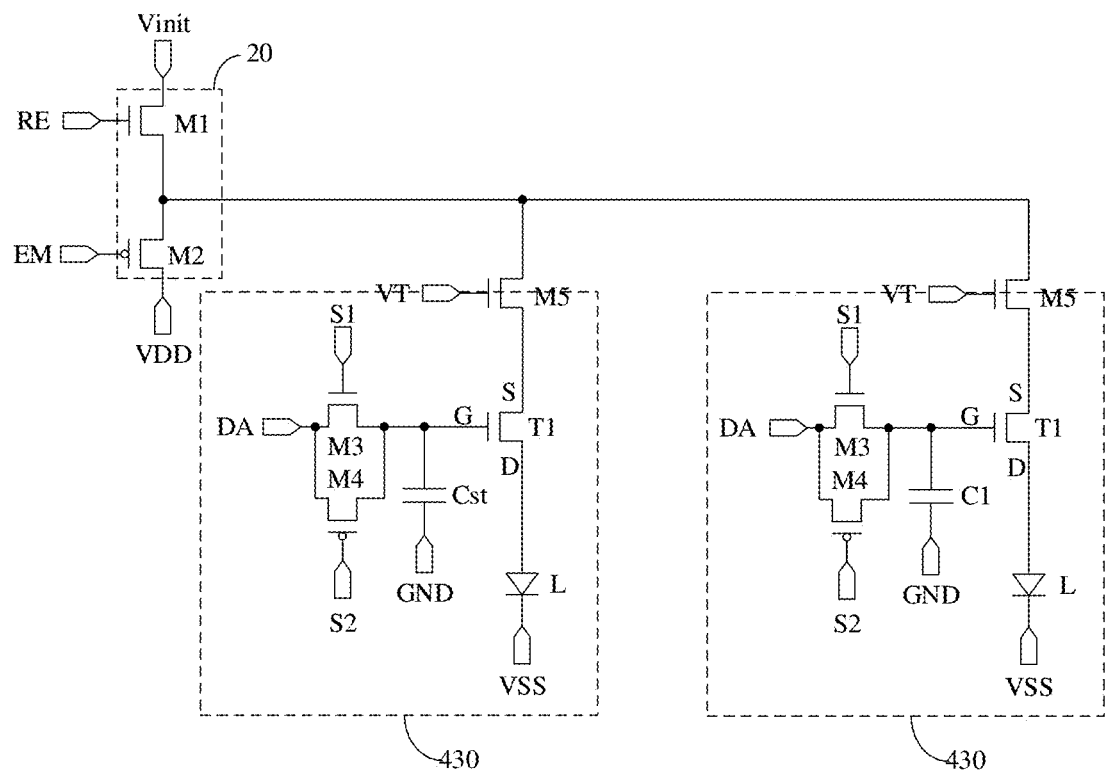
FIG. 1D is a circuit diagram of a voltage control circuit and a pixel circuit of the display panel provided by the embodiments of the present disclosure.

FIG. 1D is a circuit diagram of the voltage control circuit and the pixel circuit of the display panel provided by the embodiments of the present disclosure. For example, the drive transistor T1 in the pixel circuit 430 is an N-type transistor; if a current flows from its first terminal S to its second terminal D, the first terminal S is taken as its source electrode and the second terminal D is taken as its drain electrode; if a current flows from its second terminal D to the first terminal S, the second terminal D is taken as its source electrode and the first terminal S is taken as its drain electrode. Further, the light-emitting device L for example is an OLED. The anode electrode of the OLED is electrically connected to the second terminal D of the drive transistor T1, and the cathode electrode of the OLED is electrically connected with a second power supply terminal VSS. The voltage of the second power supply terminal VSS for example is a negative voltage or a ground voltage VGND (generally 0V), and the voltage of the initialization signal Vinit for example is also set to the ground voltage VGND, which is not limited here. For example, the OLED is the Micro OLED or the Mini OLED, which is further beneficial to realize the organic light-emitting display panel with high PPI.

For example, taking the case that two pixel circuits 430 are included in a row as an example, each of the plurality of voltage control circuits 20 include a first switch transistor M1 and a second switch transistor M2. The gate electrode of the first switch transistor M1 is configured to receive the reset control signal RE, the first electrode of the first switch] transistor M1 is configured to receive the initialization signal Vinit, and the second electrode of the first switch transistor M1 is coupled to the second electrode of the second switch transistor M2. The gate electrode of the second switch transistor M2 is configured to receive the light emission control signal EM, the first electrode of the second switch transistor M2 is configured to receive the first power supply signal VDD, and the second electrode of the second switch transistor M2 is coupled to the second electrode of the first switch transistor M1.

For example, the types of the first switch transistor M1 and the second switch transistor M2 may be different from each other. For example, the first switch transistor M1 is an N-type transistor and the second switch transistor M2 is a P-type transistor. Alternatively, the first switch transistor M1 is a P-type transistor and the second switch transistor M2 is an N-type transistor. Of course, the first switch transistor M1 and the second switch transistor M2 may be of the same type. In actual application, the types of the first switch transistor M1 and the second switch transistor M2 are designed according to the actual application environment, and are not limited here.

For example, the pixel circuit 430 includes a third switch transistor M3 and the storage capacitor Cst. For example, the gate electrode of the third switch transistor M3 is configured to receive a first gate scanning signal S1, the first electrode of the third switch transistor M3 is configured to receive a data signal DA, and the second electrode of the third switching transistor M3 is coupled to the gate electrode G of the drive transistor T1. The first terminal of the storage capacitor Cst is coupled to the gate electrode G of the drive transistor T1, and the second terminal of the storage capacitor Cst is coupled to the ground terminal GND.

For example, the pixel circuit 430 further includes a fourth switch transistor M4. For example, the gate electrode of the fourth switch transistor M4 is configured to receive a second gate scanning signal S2, the first electrode of the fourth switch transistor M4 is configured to receive the data signal DA, and the second electrode of the fourth switch transistor M4 is coupled to the gate electrode G of the drive transistor T1. Furthermore, the fourth switch transistor M4 and the third switch transistor M3 are of different types. For example, the third switch transistor M3 is an N-type transistor and the fourth switch transistor M4 is a P-type transistor. Alternatively, the third switch transistor M3 is a P-type transistor and the fourth switch transistor M4 is an N-type transistor.

For example, the pixel circuit 430 further includes a fifth switch transistor M5. The gate electrode of the fifth switch transistor M5 is configured to receive a reset control signal VT, the first electrode of the fifth switch transistor M5 is coupled to the source electrode S of the drive transistor T1, and the second electrode of the fifth switch transistor M5 is coupled to the second electrode of the second switch transistor M2.

It should be noted that, if the voltage of the data signal DA is a voltage corresponding to a high gray scale, for example, the fourth switch transistor M4 of the P type is turned on to transmit the data signal DA to the gate electrode G of the drive transistor T1, so that the voltage of the data signal DA is prevented from being influenced by the threshold voltage of the third switch transistor M3 of the N type. If the voltage of the data signal DA is a voltage corresponding to a low gray scale, the third switch transistor M3 of the N type is turned on to transmit the data signal DA to the gate electrode G of the drive transistor T1, so that the voltage of the data signal DA is prevented from being influenced by the threshold voltage of the fourth switch transistor M4 of the P type. In this way, the voltage range input to the gate electrode G of the drive transistor T1 is improved.

For example, the work function of the material of the first transparent conductive layer 21 is greater than 4.60 eV, which improves the work function of the anode electrode 2, thereby improving the hole injection rate into the light-emitting layer 4.

For example, the material of the first transparent conductive layer 21 includes at least one of indium tin oxide (ITO), indium zinc oxide (IZO), and aluminum-doped zinc oxide (AZO). The work function of these transparent conductive materials is greater, and is greater than the work function of some elemental metals. For example, ITO has a work function of about 4.8 eV, IZO has a work function ranged from 4.9 eV to 5.2 eV, and AZO has a work function of about 5.2 eV. For example, silver has a work function of about 4.6 eV, aluminum has a work function of about 4.28 eV, and chromium has a work function of about 4.3 eV-4.5 eV.

For example, the reflectivity of the metal layer 23 is equal to or greater than 90%. For example, the material of the metal layer 23 is silver (Ag). Of course, in other embodiments, the material of the metal layer 23 includes other metals, such as aluminum (Al). The surface of Al is easier to be oxidized to form a passivation film, which affects the bonding strength between the metal layer and ITO. Therefore, the bonding strength between Ag and ITO is higher than that between Al and ITO. It should be noted that the material of the metal layer 23 is not limited to the types listed above.

The metal layer 23 includes a first surface 231 facing the base substrate 1, a second surface 232 opposite to the first surface 231 and located on a side of the first surface 231 facing away from the substrate 1, and a side surface 233 intersecting with both the first surface 231 and the second surface 232. For example, the second surface 232 of the metal layer 23 is in direct contact with the first transparent conductive layer 21. The first transparent conductive layer 21 covers the second surface 232 and the side surface 233 of the metal layer 23 to prevent the metal layer 23 from contacting the light-emitting layer 4, so that only the first transparent conductive layer 21 having a higher work function contacts the light-emitting layer 4 and the metal layer 23 does not contact the light-emitting layer 4 to improve the hole injection rate into the light-emitting layer 4. For example, the first transparent conductive layer 21 covers the entire second surface 232 and the entire side surface 233 of the metal layer 23 so that the entire second surface 232 and the entire side surfaces 233 do not contact the light emitting layer 4. That is, as shown in FIG. 1A and FIG. 1B, the orthographic projection of the metal layer 23 on the base substrate 1 is located within the orthographic projection of the first transparent conductive layer 21 on the base substrate 1.

For example, the thickness of the metal layer 23 (i.e. the thickness in the direction in which the first transparent conductive layer 21 and the metal layer 23 are stacked, that is, the thickness in the direction perpendicular to the main surface of the base substrate 1) is greater than the thickness of the first transparent conductive layer 21 (i.e. the thickness in the direction in which the first transparent conductive layer 21 and the metal layer 23 are stacked, that is, the thickness in the direction perpendicular to the main surface of the base substrate 1). For example, the thickness of the first transparent conductive layer 21 is equal to or smaller than 80 angstroms, and the thickness of the metal layer 23 is equal to or greater than 100 angstroms, and is equal to or smaller than 300 angstroms. A large thickness of the first transparent conductive layer 21 leads to a decrease of the light transmittance of the anode electrode 2, while a small thickness of the metal layer 23 leads to a decrease of the reflectance of the anode electrode 2, which are not beneficial to improve the light extraction rate of the light-emitting device.

For example, the first transparent conductive layer 21 includes a first surface 211 facing the base substrate 1, a second surface 212 opposite to the first surface 211 and located on a side of the first surface 211 facing away from the substrate 1, and a side surface 213 intersecting with both the first surface 211 and the second surface 212. For example, the angle α between the side surface 213 of the first transparent conductive layer 21 and the main surface 101 of the base substrate 1 (that is, the slope of the side surface of the first transparent conductive layer) is smaller than the angle β between the side surface 233 of the metal layer 23 and the main surface 101 of the base substrate 1 (that is, the slope of the side surface of the metal layer). As shown in FIG. 1B, for example, the display panel 10 includes a plurality of anode electrodes 2 spaced from each other. The light-emitting layer 4 is a continuous integral layer (that is, the light-emitting layer 4 is not broken) to cover the second surface 212 of the first transparent electrode layer 21 of each of the plurality of anode electrodes 2, the side surface 213 of the first transparent electrode layer 21 of each of the plurality of anode electrodes 2, and the gap between adjacent anode electrodes 2. The cathode electrode 8 is located on the side of the light-emitting layer 4 facing away from the plurality of anode electrodes 2 and covers the light-emitting layer 4. For example, the light-emitting layer 4 emits white light. For example, the cathode electrode 8 is a continuous integral electrode as shown in FIG. 1B. In other embodiments, the cathode electrode for example includes a plurality of portions spaced apart from each other. The slope of the side surface 213 of the first transparent conductive layer 21 is smaller than the slope of the side surface 233 of the metal layer 23, so that the disconnection of the light-emitting layer 4 is avoided. Of course, in other embodiments, the slope of the side surface of the first transparent conductive layer may be equal to or greater than the slope of the side surface of the metal layer.

Figure 1E:
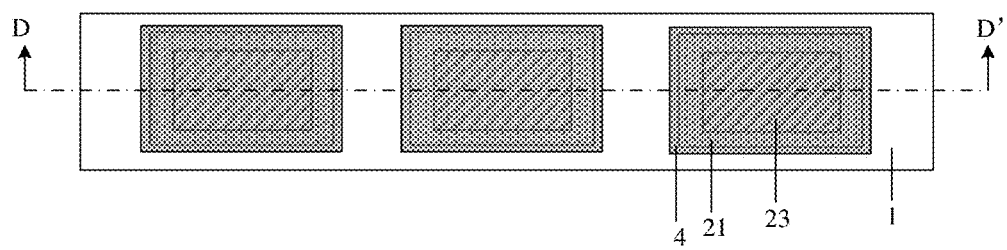
FIG. 1E is another schematic structural plan view of three pixels of the display panel according to the embodiments of the present disclosure.
Figure 1F:
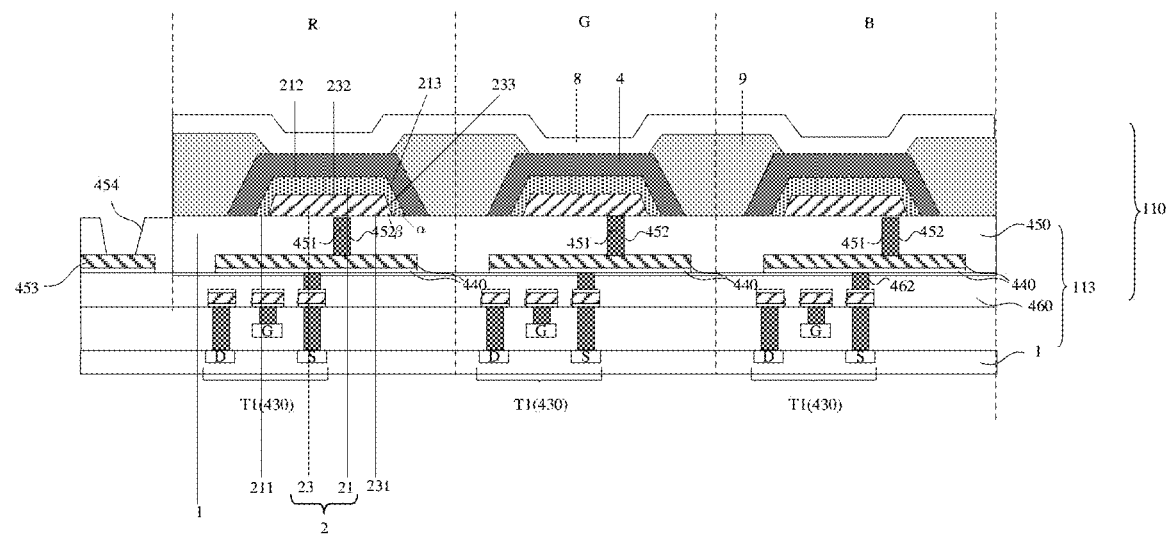
FIG. 1F is a schematic cross-sectional view taken along the line D-D' in FIG. 1E.

For example, in the embodiments of the disclosure, as shown in FIG. 1E and FIG. 1F, the display panel 10 includes a plurality of pixel units and a plurality of anode electrodes 2, each of the plurality of pixel units includes a plurality of pixels emitting light of different colors, and one of the plurality of anode electrodes 2 is provided in each of the plurality of pixels. The light-emitting layer 4 includes a plurality of portions, and one of the plurality of portions of the light-emitting layer 4 is disposed in each of the plurality of pixels. For example, each of the plurality of pixel units includes three pixels of the red pixel, the green pixel, and the blue pixel, and the plurality of portions of the light-emitting layer 4 are respectively located in the three pixels of the red pixel, the green pixel, and the blue pixel, and are configured to respectively emit red light, green light, and blue light. Each of the plurality of portions of the light-emitting layer 4 covers the second surface 212 of the first transparent electrode layer 21 of the anode electrode 2 in the corresponding pixel, and further covers the side surface 213 of the first transparent electrode layer 21 of the anode electrode 2 in the corresponding pixel. In this case, for example, the display panel 10 further includes a pixel defining layer 9, the pixel defining layer 9 includes openings and main body portions, the openings exposes the portions of the light-emitting layer 4, and each main body portion is arranged between two adjacent ones of the plurality of pixels to prevent crosstalk of light of different colors emitted by the adjacent pixels. The cathode electrode 8 is located on the side of the light-emitting layer 4 facing away from the plurality of anode electrodes 2, and covers the light-emitting layer 4 and the pixel defining layer 9.

For example, in the embodiments of the present disclosure, the light-emitting layer 4 is an electroluminescent layer, for example, an organic electroluminescent layer or an inorganic electroluminescent layer. For example, the light-emitting layer 4 includes an organic light-emitting layer.

For example, in the embodiments of the present disclosure, the base substrate 1 is a substrate such as a quartz substrate, a glass substrate, a flexible substrate and the like, or is an insulation layer such as a flat insulation layer. The embodiments of the present discourse are not limited to the types listed above, and the base substrate 1 may be designed as required.

Figure 2A:
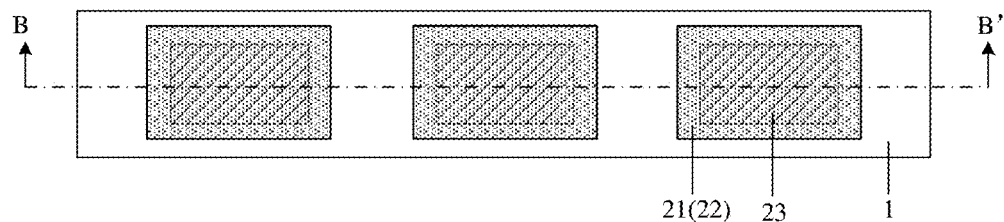
FIG. 2A is another schematic structural plan view of three pixels of the display panel according to the embodiments of the present disclosure.
Figure 2B:
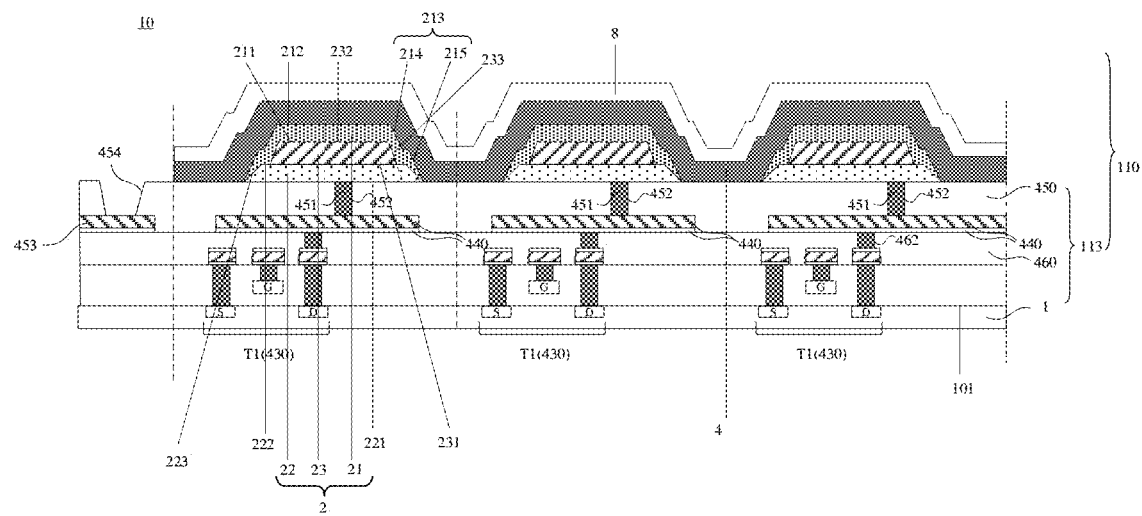
FIG. 2B is a schematic cross-sectional view taken along line the B-B' in FIG. 2A.

FIG. 2A is another schematic structural plan view of three pixels of the display panel according to the embodiments of the present disclosure. FIG. 2B is a schematic cross-sectional view taken along the line B-B' in FIG. 2A. The display panel 10 shown in FIG. 2B differs from the light-emitting device shown in FIG. 1B in that the anode electrode 2 further includes a second transparent conductive layer 22. The second transparent conductive layer 22 is stacked with the first transparent conductive layer 21 and the metal layer 23 in the direction perpendicular to the base substrate 1, and is located on a side of the metal layer 23 facing away from the first transparent conductive layer 21. For example, the second transparent conductive layer 22 is located between the metal layer 23 and the drive circuit, the first transparent conductive layer 21 and the second transparent conductive layer 22 completely encapsulate the metal layer 23, and the orthographic projection of the metal layer 23 on the base substrate 1 is located within the orthographic projection of the second transparent conductive layer 22 on the base substrate 1. For example, the metal layer 23 is in direct contact with the second transparent conductive layer 22, that is, there is no other layer or structure between the metal layer 23 and the second transparent conductive layer 22. The work function of the second transparent conductive layer 22 is greater than the work function of the metal layer 23, and the reflectivity of the metal layer 23 is greater than the reflectivity of the second transparent conductive layer 22. Arranging the second transparent conductive layer 22 further improves the hole injection capability into the light-emitting layer 4. In addition, for example, the second transparent conductive layer 22 is located on a side of the metal layer 23 close to the base substrate 1, for example, the second transparent conductive layer 22 is in contact with the first insulation layer 450. Due to the difference between the material of the second transparent conductive layer 22 and the material of the metal layer 23, the bonding strength between the second transparent conductive layer 22 and the first insulation layer 450 is higher than the bonding strength between the metal layer 23 and the first insulation layer 450, so that the bonding strength between the anode electrode 2 and the first insulation layer 450 is improved in FIG. 2B, and the structural stability of the display panel 10 is improved.

For example, in the structure shown in FIG. 2B, the light-reflecting layer 440 is electrically connected with the second transparent conductive layer 22 of the anode electrode 2 through the first via hole 452. That is, the metal members 451 is respectively in contact with the light-reflecting layer 440 and the second transparent conductive layer 22 of the anode electrode 2 to electrically connect the light-reflecting layer 440 and the second transparent conductive layer 22.

For example, as shown in FIG. 2B, the second transparent conductive layer 22 includes a first surface 221 facing the base substrate 1, a second surface 222 opposite to the first surface 221 and located on a side of the first surface 221 facing away from the substrate 1, and a side surfaces 223 intersecting with both the first surface 221 and the second surface 222. The first transparent conductive layer 21 covers the side surface 223 of the second transparent conductive layer 22 and a portion of the second surface 222 of the second transparent conductive layer 22 that is not covered by the metal layer 23, which is beneficial to reduce the slope of the side surface 213 of the first transparent conductive layer 21 and to more tightly encapsulate the metal layer 23 to avoid the influence of the metal layer 23 on the hole injection rate into the light-emitting layer 4. As shown in FIG. 2A and FIG. 2B, the orthographic projection of the metal layer 23 on the base substrate 1 is located within the orthographic projection of the first transparent conductive layer 21 on the base substrate 1. For example, the orthographic projection of the second transparent conductive layer 22 on the base substrate 1 is located within the orthographic projection of the first transparent conductive layer 21 on the base substrate 1. For example, the orthographic projection of the second transparent conductive layer 22 on the base substrate 1 completely coincides with the orthographic projection of the first transparent conductive layer 21 on the base substrate 1.

For example, the thickness of the metal layer 23 (i.e. the thickness in a stacking direction of the metal layer 23 and the second transparent conductive layer 22, that is, the thickness in the direction perpendicular to the base substrate) is greater than the thickness of the second transparent conductive layer 22 (i.e. the thickness in a stacking direction of the metal layer 23 and the second transparent conductive layer 22, that is, the thickness in the direction perpendicular to the base substrate). For example, the thickness of the second transparent conductive layer 22 is smaller than or equal to 80 angstroms, and a large thickness of the second transparent conductive layer 22 may result in a decrease of light transmittance of the anode electrode.

For example, the material of the second transparent conductive layer 22 includes at least one of indium tin oxide (ITO), indium zinc oxide (IZO), and aluminum-doped zinc oxide (AZO). For example, the material of the second transparent conductive layer 22 is the same as the material of the first transparent conductive layer 21.

For example, in the structure shown in FIG. 2B, the first transparent conductive layer 21 includes the first surface 211 facing the base substrate 1, the second surface 212 opposite to the first surface 211 and located on the side of the first surface 211 facing away from the base substrate 1, and the side surface 213 intersecting with both the first surface 211 and the second surface 212. Because the second transparent conductive layer 22 and the metal layer 23 have a height difference therebetween and the first surface 221 of the second transparent conductive layer 22 includes a portion not covered by the metal layer 23, the side surface 213 of the first transparent conductive layer 21 includes a first portion 214 facing away from the base substrate 1 and a second portion 215 close to the base substrate 1 in a direction perpendicular to the main surface 101 of the base substrate 1. The included angle α between the first portion 214 of the side surface 213 of the first transparent conductive layer 21 and the main surface 101 of the base substrate 1 (that is, the slope of the first portion 214) is smaller than the included angle β between the side surface 233 of the metal layer 23 and the main surface 101 of the base substrate 1 (that is, the slope of the side surface of the metal layer), and the included angle θ between the second portion 214 of the side surface 213 of the first transparent conductive layer 21 and the main surface 101 of the base substrate 1 (that is, the slope of the second portion 214) is smaller than the included angle β between the side surface 233 of the metal layer 23 and the main surface 101 of the base substrate 1 (that is, the slope of the side surface of the metal layer), so as to avoid the disconnection of the light-emitting layer 4. It should be noted that the first insulation layer 450 is substantially parallel to the main surface 101 of the base substrate 1, the included angle between an inclined surface and the main surface 101 of the base substrate 1 is substantially equal to the included angle between the inclined surface and the surface of the first insulation layer 450 facing away from the substrate 1, which is the case for the above-mentioned included angle α, included angle β, and included angle θ.

Other features and effects not mentioned in the light-emitting device shown in FIG. 2B are the same as those in FIG. 1B, and the pixel circuit structure is also the same as those in FIG. 1B-FIG. 1D. Please refer to the previous description, which will not be repeated here.

Figure 2C:
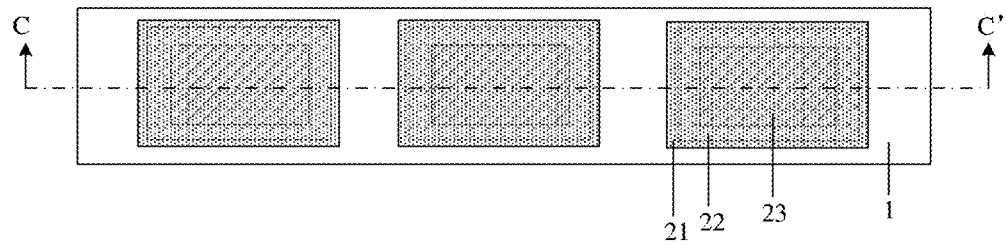
FIG. 2C is still another schematic structural plan view of three pixels of the display panel according to the embodiments of the disclosure.
Figure 2D:
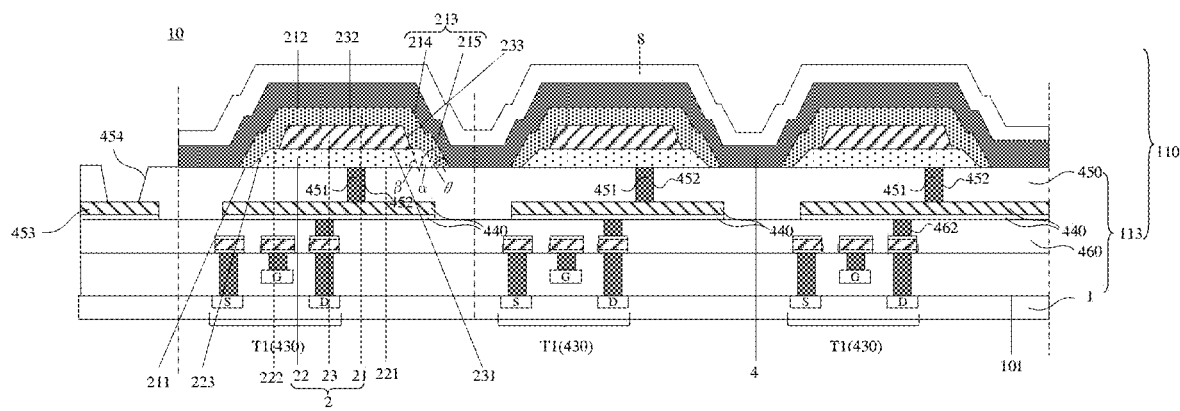
FIG. 2D is a schematic cross-sectional view taken along the line C-C' in FIG. 2C.

FIG. 2C is still another schematic structural plan view of three pixels of the display panel according to the embodiments of the disclosure. FIG. 2D is a schematic cross-sectional view taken along the line C-C' in FIG. 2C. The light-emitting device shown in FIG. 2D has the following differences from the light-emitting device in FIG. 2B. In FIG. 2B, the orthographic projection of the first transparent conductive layer 21 on the base substrate 1 substantially coincides with the orthographic projection of the second transparent conductive layer 22 on the base substrate 1. In FIG. 2C, the first transparent conductive layer 21 covers a portion of the main surface 101 of the base substrate 1 in addition to covering the metal layer 23 and the second transparent conductive layer 22, that is, the orthographic projection of the second transparent conductive layer 22 on the base substrate 1 is located within the orthographic projection of the first transparent conductive layer 21 on the base substrate 1 and overlaps with a portion of the orthographic projection of the first transparent conductive layer 21 on the base substrate 1. Therefore, the first surface 211 of the first transparent conductive layer 21 facing the base substrate 1 includes a portion in contact with the first insulation layer 450, which is beneficial to more tightly encapsulate the metal layer 23 to avoid the influence of the metal layer 23 on the hole injection rate into the light-emitting layer 4.

For example, the display panel is a Micro LED display panel, such as a Micro OLED display panel. The Micro LED display panel has higher requirements on luminous brightness. By adopting the light-emitting device provided by the embodiments of the present disclosure, the hole injection rate into the light-emitting layer is improved, the intensity of light emitted by the light-emitting layer is high, and meanwhile, the anode electrode has higher reflectivity, so that the display panel has higher display brightness. Moreover, the display panel may be of other types, such as an OLED display panel and the like.

Figure 3:
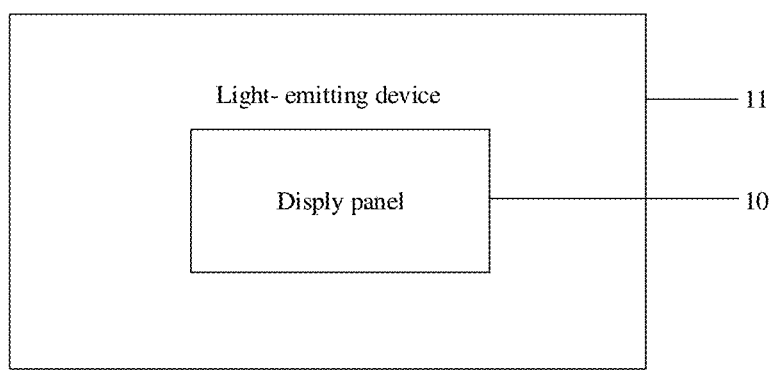
FIG. 3 is a schematic diagram of a display apparatus according to the embodiments of the present disclosure.

At least one embodiment of the present disclosure provides a display apparatus, and the display apparatus includes any one of the display panels provided by the embodiments of the present disclosure. FIG. 3 is a schematic diagram of the display apparatus according to the embodiments of the present disclosure. As shown in FIG. 3, the display apparatus 11 provided by the embodiments of the present disclosure includes any of the display panels 10 provided by the embodiments of the present disclosure.

The display apparatus is, for example, a Micro LED display apparatus, an OLED display apparatus, etc. The display apparatus may be, for example, a mobile phone, a tablet computer, a television, a display, a notebook computer, a digital photo frame, a navigator, etc., and other products or components with display functions.

At least one embodiment of the present disclosure provides a manufacturing method of a display panel, the manufacturing method includes: providing a base substrate; forming a plurality of pixels at a side of the base substrate, in which at least one of the plurality of pixels includes a light-emitting device, the light-emitting device includes an anode electrode and a light-emitting layer, the anode electrode includes a first transparent conductive layer and a metal layer which are stacked, the first transparent conductive layer is located on a side of the metal layer facing away from the base substrate, the light-emitting layer is stacked with the anode electrode and is located on a side of the first transparent conductive layer facing away from the metal layer, the work function of the first transparent conductive layer is greater than the work function of the metal layer, and the reflectivity of the metal layer is greater the reflectivity of the first transparent conductive layer; and forming a drive circuit, in which the drive circuit is located between the base substrate and the anode electrode, the drive circuit includes a drive transistor and a storage capacitor, the drive transistor includes a source electrode, a drain electrode, and a gate electrode, one of the source electrode and the drain electrode is electrically connected with the anode electrode, the gate electrode is electrically connected with the storage capacitor, and the storage capacitor is configured to store data signals.

For example, forming the first transparent conductive layer and the metal layer includes: forming a first mask on the base substrate, and forming the first transparent conductive layer and the metal layer by using the first mask.

Figure 4A:
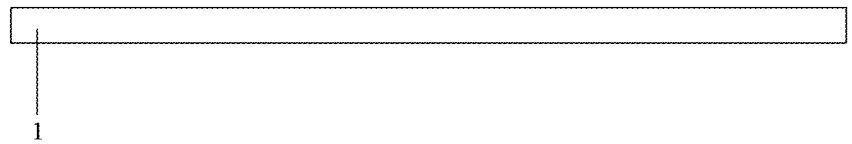
FIG. 4A-FIG. 4J are schematic diagrams of a manufacturing method of the display panel according to the embodiments of the present disclosure.

Illustratively, FIG. 4A-FIG. 4J are schematic diagrams of the manufacturing method of the display panel according to the embodiments of the present disclosure;

As shown in FIG. 4A, the base substrate is provided. For example, the base substrate 1 is a substrate such as a quartz substrate, a glass substrate, a flexible substrate and the like, or is an insulation layer such as a flat insulation layer. The embodiments of the present discourse are not limited to the types listed above, and the base substrate 1 may be designed as required.

Figure 4B:
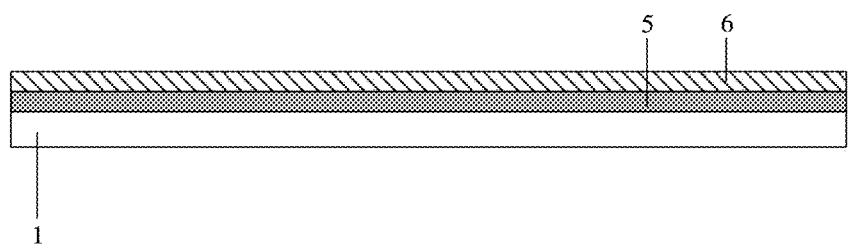
Figure 4C:
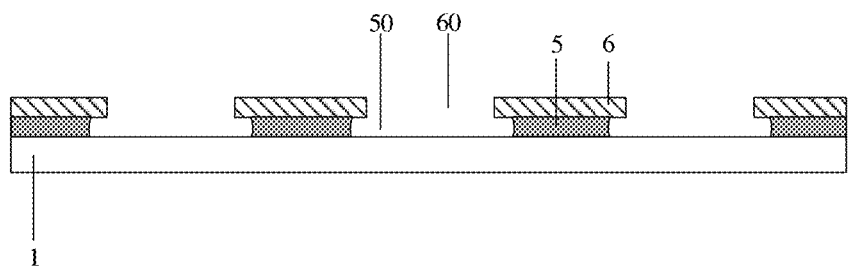

For example, the first mask is formed as shown in FIG. 4B-FIG. 4C.

As shown in FIG. 4B, a base layer 5 is formed on the base substrate 1, and a photoresist layer 6 is formed on the base layer 5. For example, the base layer 5 is an anti-reflection layer; and for example, the material of the base layer 5 is an organic polymer or copolymer. In some embodiments, the material of the base layer 5 is highly crosslinked. In some embodiments, the material of the base layer 5 includes monomers having a hydroxyl group. In some embodiments, the material of the base layer 5 includes monomer units capable of hydrating upon being exposed to water of a certain pH value. Unsaturated hydrocarbons are generally easy to hydrate. In some embodiments, the base layer 5 includes monomer units having olefin, alkyne, or aromatic groups. In some embodiments, the base layer 5 includes ester monomers, acrylate monomers, or isocyanate monomers. In some embodiments, the base layer 5 is an acrylate polymer or copolymer. In some embodiments, the base layer 5 includes aromatic monomers. In some embodiments, the base layer 5 is a styrene polymer or copolymer. On one hand, a second opening 50 is obtained by taking advantage of the property that the base layer 5 is easily soluble in a developing solution. On the other hand, the anti-reflection effect of the base layer 5 is beneficial to improve the pattern accuracy of the first mask.

It should be noted that the thickness of the base layer 5 in the direction perpendicular to the base substrate 1 is adjusted as required, for example, the thickness of the base layer 5 is determined according to the thickness of the film to be formed in the second opening 50 in the direction perpendicular to the base substrate 1. For example, the thickness of the base layer 5 is greater than or equal to the sum of the thickness of the first transparent conductive layer 21 and the thickness of the metal layer 23 to ensure that the steps of forming the first transparent conductive layer 21 and the metal layer 23 are smoothly performed.

As shown in FIG. 4C, the base layer 5 and the photoresist layer 6 shown in FIG. 4B are exposed and developed by using a second mask (not shown in FIG. 4B) to obtain the first mask. The material of the base layer 5 is more soluble in the developing solution than the material of the photoresist layer 6 to form a second opening 50 in the base layer 5 and a first opening 60 in the photoresist layer 6. The second opening 50 and the first opening 60 are stacked in a direction perpendicular to the base substrate 1 and communicate with each other, the orthographic projection of the first opening 60 on the base substrate 1 is located in the orthographic projection of the second opening 50 on the base substrate 1, and the second opening 50 includes a first portion and a second portion, the orthographic projection of the first portion on the base substrate 1 coincides with the orthographic projection of the first opening 60 on the base substrate 1, and the orthographic projection of the second portion on the base substrate 1 does not coincide with the orthographic projection of the first opening 60 on the base substrate 1. The first opening 60 is located at a side of the second opening 50 facing away from the substrate 1.

Figure 4D:
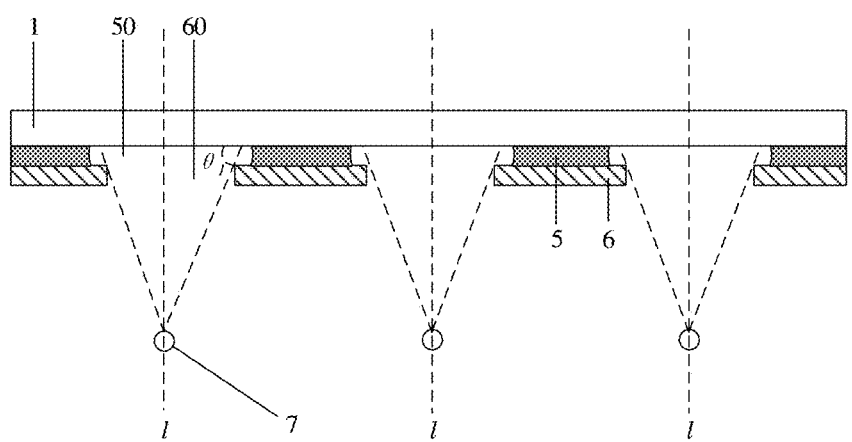

Then, as shown in FIG. 4D, the first opening 60 has a normal line l passing through the center of the first opening 60 and perpendicular to the base substrate 1. For example, forming the metal layer by using the first mask includes: arranging a metal material source 7 on the side of the first opening 60 facing away from the base substrate 1, and forming the metal layer by vapor deposition using the metal material source 7; the metal material source is located at the normal line l on which the center position of the first opening 60 is located, and the distance between the metal material source 7 and the base substrate 1 is the first height h1 in the direction perpendicular to the base substrate 1. In the process of vapor deposition by using the metal material source 7, the metal material from the metal material source 7 passes through the first opening 60 and the second opening 50 in sequence to reach a first position on the base substrate 1 farthest from the normal line l, and a first included angle $\theta_1$ is formed between the connection line of the first position and the metal material source 7 and the base substrate 1. In the process of vapor deposition by using the metal material source 7, the base substrate 1 is rotated around the normal line l or an axial line parallel to the normal line l, thereby forming the metal layer 23 as shown in FIG. 4F. For example, the normal l further passes through the center of the second opening 50. In this case, the second opening 50 and the first opening 60 are concentric, for example, the planar shape of the second opening 50 and the planar shape of the first opening 60 are concentric circles, concentric rectangles, etc.

Figure 4E:
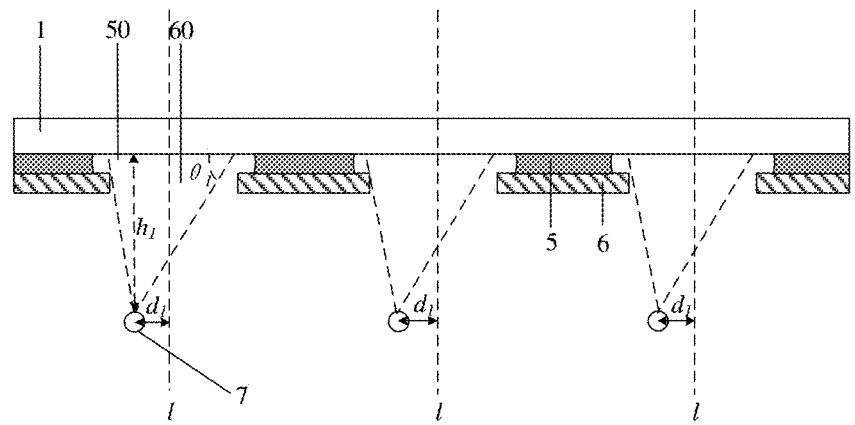
Figure 4F:
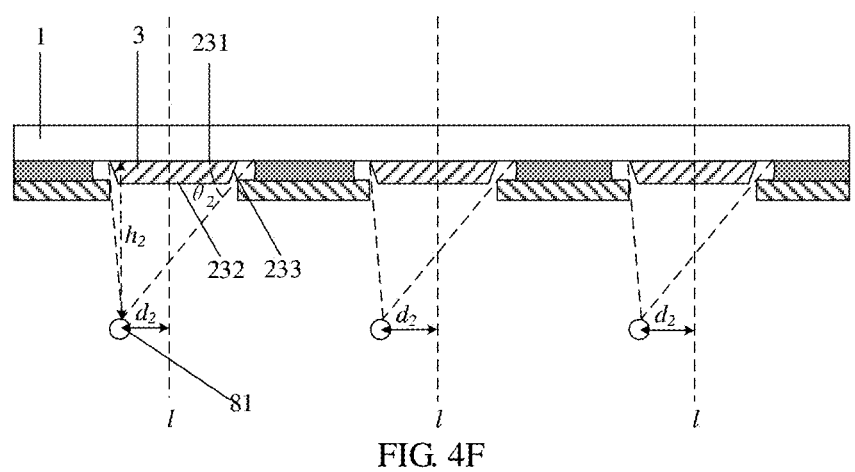

Alternatively, as shown in FIG. 4E, the forming the metal layer by using the first mask includes: arranging the metal material source 7 on the side of the first opening 60 facing away from the base substrate 1, and forming the metal layer by vapor deposition by using the metal material source 7; the metal material source 7 is spaced apart from the normal line l by a first distance $d_1$ in a direction parallel to the base substrate 1, the normal line l is perpendicular to the base substrate 1, and the distance between the metal material source 7 and the base substrate 1 in the direction perpendicular to the base substrate 1 is the first height $h_1$. In the process of vapor deposition by using the metal material source 7, the metal material from the metal material source 7 passes through the first opening 60 and the second opening 50 in sequence to reach a first position on the base substrate 1 farthest from the normal line l, and a first included angle $\theta_1$ is formed between the connection line of the first position and the metal material source 7 and the base substrate 1. In the process of vapor deposition by using the metal material source 7, the base substrate 1 is rotated around the normal line l or the axial line parallel to the normal line l, thereby forming the metal layer 23 as shown in FIG. 4F.

Figure 4G:
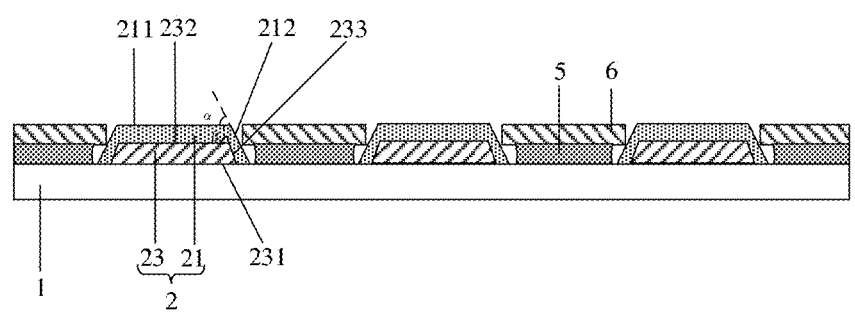

Then, as shown in FIG. 4F, forming the first transparent conductive layer by using the first mask includes: arranging the first transparent conductive material source 81 on a side of the first opening 60 facing away from the base substrate 1, and forming the first transparent conductive layer by vapor deposition using the first transparent conductive material source 81. During vapor deposition by using the first transparent conductive material source 81, the transparent conductive material from the first transparent conductive material source 81 sequentially passes through the first opening 60 and the second opening 50 to reach a second position on the base substrate 1 farthest from the normal line l, and a second included angle $\theta_2$ is formed between the connection line of the second position and the first transparent conductive material source 81 and the base substrate 1, and the second included angle $\theta_2$ is smaller than the first included angle $\theta_1$. The metal layer 23 includes the first surface 231 facing the base substrate 1, the second surface 232 opposite to the first surface 231 and located on the side of the first surface 231 facing away from the base substrate 1 in the direction perpendicular to the base substrate 1, and the side surface 233 intersecting with both the first surface 231 and the second surface 232. In the process of vapor deposition by using the first transparent conductive material source 8, the base substrate 1 is rotated around the normal line l or the axial line parallel to the normal line l to form the first transparent conductive layer 21 as shown in FIG. 4G, so that the first transparent conductive layer 21 covers the second surface 232 and the side surface 233 of the metal layer 23 to prevent the metal layer 23 from contacting with the light-emitting layer to be formed on the first transparent conductive layer 21; the work function of the first transparent conductive layer 21 is greater than the work function of the metal layer, the first transparent conductive layer 21 is in contact with the light-emitting layer to be formed on the first transparent conductive layer 21, which is beneficial to improve the hole injection rate into the light-emitting layer and improve the intensity of light emitted. In this way, the first transparent conductive layer 21 and the metal layer 23 of the anode electrode stacked in the direction perpendicular to the base substrate 1 are formed. For example, in the direction parallel to the base substrate 1, the first transparent conductive material source 81 is spaced apart from the normal line l by a second distance $d_2$, and the second distance $d_2$ is greater than the first distance $d_1$. For example, the distance between the first transparent conductive material source 81 and the base substrate 1 is a second height $h_2$, and the second height $h_2$ is equal to the first height $h_1$. Thus, the formation of the first transparent conductive layer 21 is realized, and the first transparent conductive layer 21 covers the second surface 232 and the side surface 233 of the metal layer 23 to achieve the above technical effects.

It should be noted that in the embodiments of the present disclosure, the distance between the first transparent conductive material source 81 and the normal line l, the distance between the first transparent conductive material source 81 and the base substrate 1, and the distance between the metal material source 7 and the base substrate 1 are not limited. As long as the target structure is formed according to the above-mentioned method, those skilled in the art may design according to actual requirements. For example, the design is based on the size of the second opening 50, the size of the first opening 60, the parameters of the vapor deposition equipment that is used, etc.

Figure 4H:
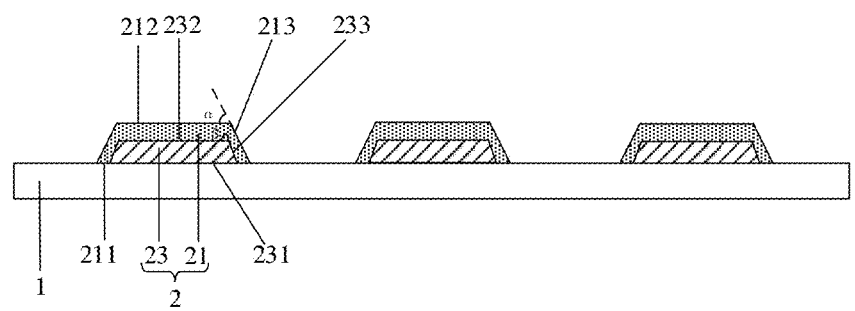

Next, as shown in FIG. 4H, the manufacturing method of the light-emitting device further includes removing the photoresist layer 6 and removing the base layer 5 after forming the metal layer 23 and the first transparent conductive layer 21. For example, the photoresist layer 6 is peeled off, and the base layer 5 is dissolved with the developing solution to remove the base layer 5.

The above method uses the same mask and the same vapor deposition method to form the first transparent conductive layer 21 and the metal layer 23. Compared with a wet etching method, the vapor deposition method achieves higher manufacturing accuracy, so that high resolution is realized in manufacturing the light-emitting devices arranged in array for the display panel. Moreover, the method of removing the photoresist layer 6 and the base layer 5 is simple.

Figure 4I:
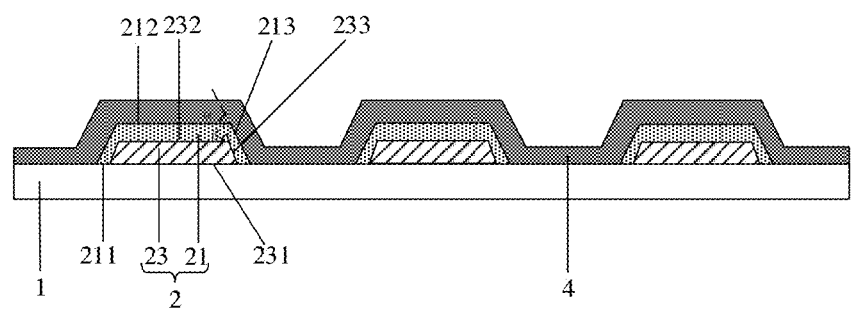

As shown in FIG. 4I, the manufacturing method of the light-emitting device further includes forming the light-emitting layer 4. For example, the light-emitting layer 4 is an electroluminescent layer, such as an organic electroluminescent layer or an inorganic electroluminescent layer, such as an organic diode light-emitting layer. In the direction perpendicular to the base substrate 1, the light-emitting layer 4 is located on the side of the first transparent conductive layer 21 facing away from the metal layer 23. The work function of the first transparent conductive layer 21 is greater than the work function of the metal layer 23, and the reflectivity of the metal layer 23 is greater than the reflectivity of the first transparent conductive layer 21. In the light-emitting device, the light emitted from the light emitting layer 4 is reflected by the anode electrode 2 and then emitted through the cathode electrode to realize display. On one hand, the work function of the transparent conductive layer 21 is larger than the work function of the metal layer 23, which is beneficial to improve the hole injection capability into the light-emitting layer, so that the intensity of light emitted by the light-emitting layer is high. On the other hand, the metal layer 23 has a higher reflectivity, which is beneficial to improve the light extraction efficiency. Therefore, luminous brightness of the display panel 10 is large.

For example, the display panel 10 includes a plurality of anode electrodes spaced from each other. The light-emitting layer 4 is a continuous integral layer (that is, the light-emitting layer 4 is not disconnected) and covers the second surface 212 of the first transparent electrode layer 21 of each of the plurality of anode electrodes, the side surface 213 of the first transparent electrode layer 21 of each of the plurality of anode electrodes, and the gap between adjacent anode electrodes 2. In this case, for example, the slope of the side surface 213 of the first transparent conductive layer 21 is smaller than the slope of the side surface 233 of the metal layer 23, so that the disconnection of the light-emitting layer 4 is avoided.

The material of the first transparent conductive layer 21, the work function of the first transparent conductive layer 21, the material of the second transparent conductive layer 22, the work function of the second transparent conductive layer 22, and the material of the metal layer 23 are described previously with respect to the embodiments of the light-emitting device.

Figure 4J:
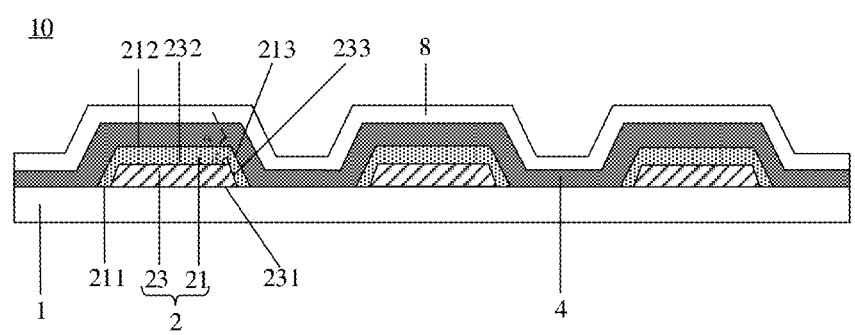

As shown in FIG. 4J, the cathode electrode 8 is formed on the side of the light-emitting layer 4 facing away from the anode electrode 2. For example, the cathode electrode 8 is a continuous integral electrode as shown in FIG. 1B. For example, in other embodiments, the cathode electrode includes a plurality of portions spaced apart from each other. For example, the material of the cathode electrode 8 is a transparent conductive material, for example, the material includes at least one of indium tin oxide (ITO), indium zinc oxide (IZO) and aluminum-doped zinc oxide (AZO). For example, the cathode electrode 8 is formed by a vapor deposition method. For example, the same first transparent conductive material source is used as the vapor deposition source to form the first transparent conductive layer and the cathode electrode.

For example, another manufacturing method provided by the embodiments of the present disclosure includes forming a second transparent conductive layer on the base substrate; the second transparent conductive layer is stacked with the first transparent conductive layer and the metal layer, and is located on the side of the metal layer facing away from the first transparent conductive layer.

For example, the second transparent conductive layer is formed by using the first mask. That is, the second transparent conductive layer, the metal layer, and the first transparent conductive layer are formed only by using the first mask. Compared with the process of forming the second transparent conductive layer, the metal layer, and the first transparent conductive layer respectively by using a plurality of masks, the method provided by the embodiments is simple to operate, simplifies the process and improves the production efficiency.

After performing the steps as shown in FIG. 4A to FIG. 4C, the steps as shown in FIG. 5A to FIG. 5D are performed. In the embodiments as shown in FIG. 5A-FIG. 5D, for example, the thickness of the base layer 5 is greater than or equal to the sum of the thickness of the first transparent conductive layer 21, the thickness of the metal layer 23, and the thickness of the second transparent conductive layer 22, so as to ensure that the steps of forming the first transparent conductive layer 21, the metal layer 23, and the second transparent conductive layer 22 are smoothly performed. The thickness of the base layer 5 in FIG. 5A to FIG. 5D is greater than the thickness of the base layer 5 in the embodiments as shown in FIG. 4A to FIG. 4C.

Figure 5A:
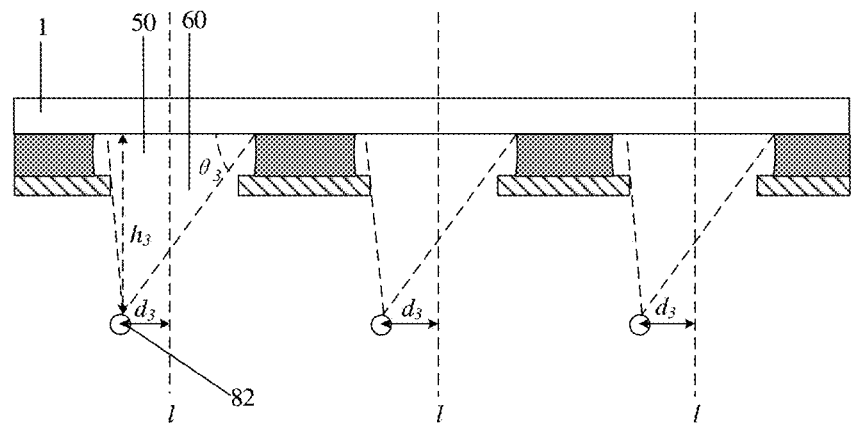
FIG. 5A-FIG. 5F are another schematic diagrams of the manufacturing method of the display panel according to the embodiments of the present disclosure.
Figure 5B:
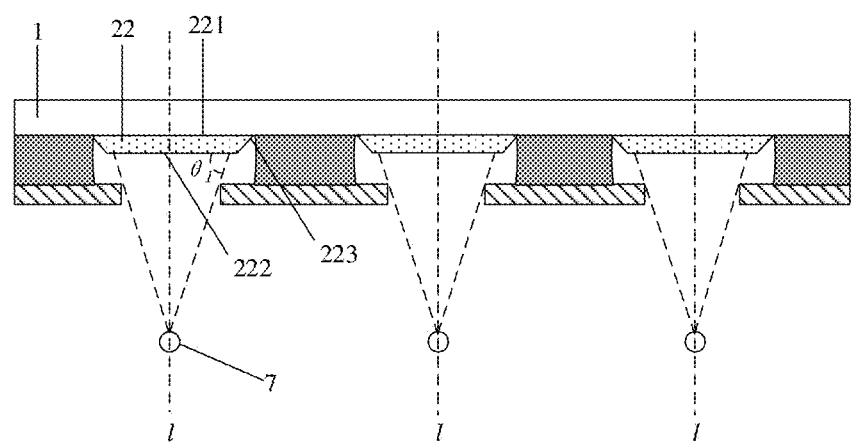

As shown in FIG. 5A, a second transparent conductive material source 82 is arranged on the side of the first opening 60 facing away from the base substrate 1, and the second transparent layer is formed by vapor deposition by using the second transparent conductive material source 82. In the process of vapor deposition by using the second transparent conductive material source 82, the transparent conductive material from the second transparent conductive material source 82 sequentially passes through the first opening 60 and the second opening 50 to reach a third position on the base substrate 1 farthest from the normal line l, and a third include angle $\theta_3$ is formed between the connection line of the third position and the second transparent conductive material source 82 and the base substrate 1. In the process of the vapor deposition by using the second transparent conductive material source 82, the base substrate 1 is rotated around the axial line parallel to the normal line l, thereby forming the second transparent conductive layer 22 as shown in FIG. 5B. The second transparent conductive layer 22 includes the first surface 221 facing the base substrate 1, the second surface 222 opposite to the first surface 221 and located on the side of the first surface 221 facing away from the base substrate 1, and the side surface 223 intersecting with both the first surface 221 and the second surface 222. For example, in the direction parallel to the base substrate 1, the second transparent conductive material source 82 is spaced apart from the normal line l by a third distance $d_3$, and the distance between the second transparent conductive material source 82 and the base substrate 1 is a third height $h_3$. Thereby, the formation of the second transparent conductive layer 22 is realized.

Next, as shown in FIG. 5B, the metal material source 7 is arranged on the side of the first opening 60 facing away from the base substrate 1, and the metal layer is formed by vapor deposition by using the metal material source 7. For example, the metal material source 7 is located on the normal line l perpendicular to the base substrate 1 on which the center position of the first opening 60 is located. In the process of vapor deposition by using the metal material source 7, the metal material from the metal material source 7 passes through the first opening 60 and the second opening 50 in sequence to reach the first position on the base substrate 1 farthest from the normal line l, and the first included angle $\theta_1$ is formed between the connection line of the first position and the metal material source 7 and the base substrate 1. The third included angle $\theta_3$ is smaller than the first included angle $\theta_1$. In the process of vapor deposition by using the metal material source 7, the base substrate 1 rotates around the normal line l or the axial line parallel to the normal line l, thereby forming the metal layer 23 as shown in FIG. 5D, which covers a portion of the second surface 222 of the second transparent conductive layer 22, that is, the metal layer 23 does not completely cover the second surface 222 of the second transparent conductive layer 22.

Figure 5C:
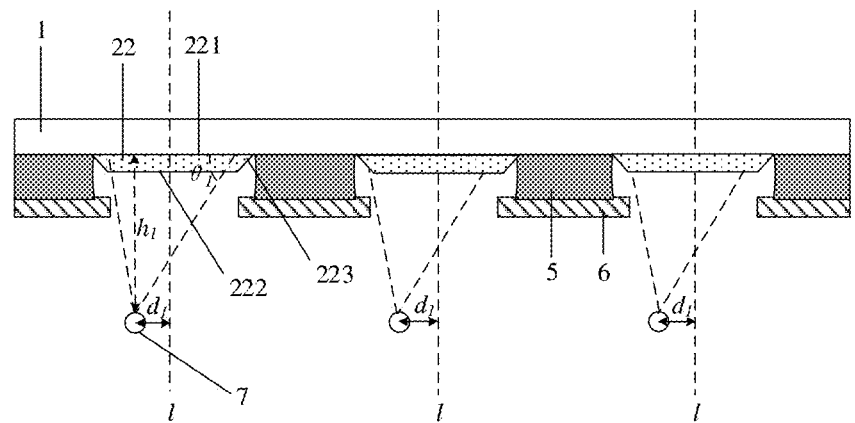

Alternatively, as shown in FIG. 5C, the forming the metal layer by using the first mask includes: arranging the metal material source 7 on the side of the first opening 60 facing away from the base substrate 1, and forming the metal layer by vapor deposition using the metal material source 7; the metal material source 7 is spaced apart from the normal line l by the first distance $d_1$ in the direction parallel to the substrate 1, the normal line l is perpendicular to the base substrate 1, and the distance between the metal material source 7 and the base substrate 1 is the first height $h_1$ in the direction perpendicular to the base substrate 1. The third distance $d_3$ is greater than the first distance $d_1$, and the third height $h_3$ is equal to the first height $h_1$, thereby forming the metal layer 23 shown in FIG. 5D, which covers a portion of the second surface 222 of the second transparent conductive layer 22, that is, the metal layer 23 does not completely cover the second surface 222 of the second transparent conductive layer 22.

Figure 5D:
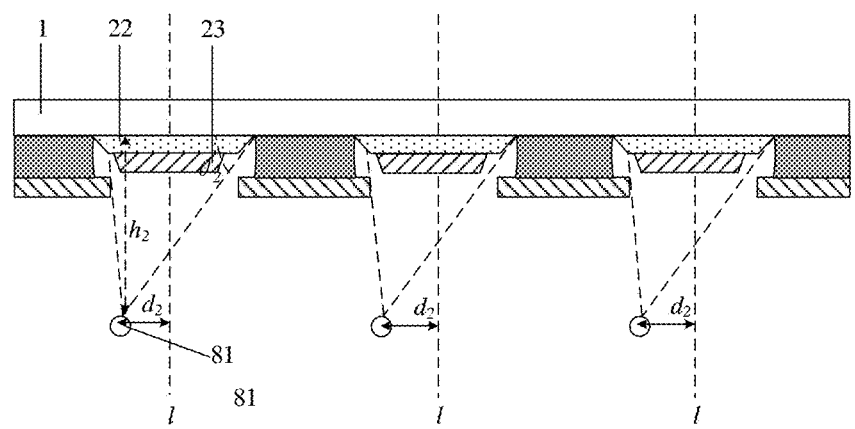
Figure 5E:
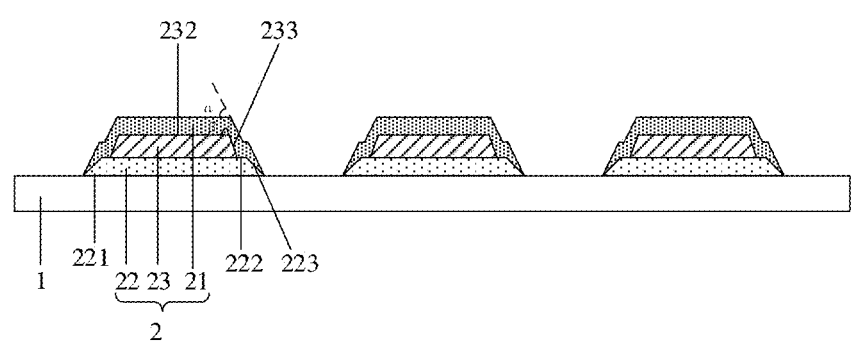
Figure 5F:
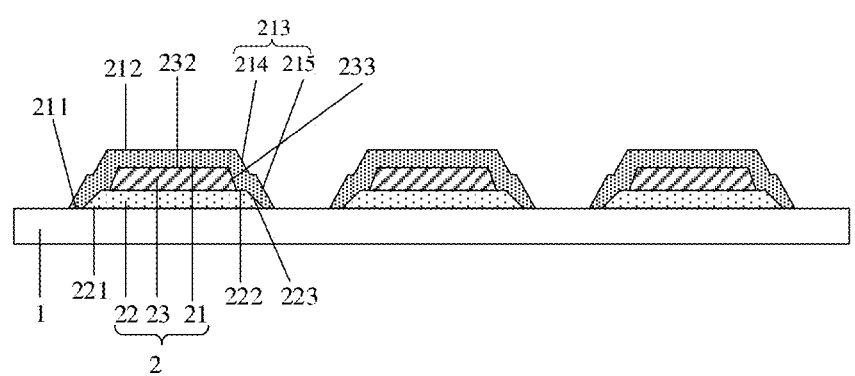

Then, as shown in FIG. 5D, the first transparent conductive material source 81 is arranged on the side of the first opening 60 facing away from the base substrate 1, and the first transparent conductive layer is formed by vapor deposition using the first transparent conductive material source 81. In the process of vapor deposition by using the first transparent conductive material source 81, the transparent conductive material from the first transparent conductive material source 81 sequentially passes through the first opening 60 and the second opening 50 to reach the second position on the base substrate 1 farthest from the normal line l, and the included angle $\theta_2$ is formed between the connection line of the first position and the first transparent conductive material source 81 and the base substrate 1. The second included angle $\theta_2$ is smaller than the first included angle $\theta_1$. In the process of vapor deposition by using the first transparent conductive material source 81, the base substrate 1 rotates around the normal line l or the axial line parallel to the normal line l, thereby forming the first transparent conductive layer 21 as shown in FIG. 5E, which covers the metal layer 23. For example, the second included angle $\theta_2$ is smaller than or equal to the third included angle $\theta_3$, so that the first transparent conductive layer 21 also covers the side surface 223 of the second transparent conductive layer 22 and a portion of the second surface 222 of the second transparent conductive layer 22 that is not covered by the metal layer 23, which is beneficial to reducing the slope of the side surface 213 of the first transparent conductive layer 21 and more tightly encapsulating the metal layer 23 to avoid the influence of the metal layer 23 on the hole injection rate into the light-emitting layer 4. For example, the second included angle $\theta_2$ is smaller than the third included angle $\theta_3$, the structure as shown in FIG. 5E is formed, and the orthographic projection of the first transparent conductive layer 21 on the base substrate 1 and the orthographic projection of the second transparent conductive layer 22 on the base substrate 1 substantially coincide with each other. For example, the second included angle $\theta_2$ is smaller than the third included angle $\theta_3$, the structure as shown in FIG. 5F is formed; the first surface 211 of the first transparent conductive layer 21 facing the base substrate 1 covers a portion of the main surface 101 of the base substrate 1 in addition to the metal layer 23 and the second transparent conductive layer. For example, in the direction parallel to the base substrate 1, the first transparent conductive material source 81 is spaced apart from the normal line l by the second distance $d_2$, and the second distance $d_2$ is greater than the first distance $d_1$. The distance between the first transparent conductive material source 81 and the base substrate 1 is the second height $h_2$, and the second height $h_2$ is equal to the first height $h_1$ and the third height $h_3$. Under this case, for example, the third distance is smaller than or equal to the second distance $d_2$, so that the first transparent conductive layer 21 covers the side surface 223 of the second transparent conductive layer 22 and a portion of the second surface 222 of the second transparent conductive layer 22 that is not covered by the metal layer 23, thereby achieving the above-mentioned technical effects.

The structure as shown in FIG. 5E is obtained after removing the base layer 5 and the photoresist layer 6. The first transparent conductive layer 21, the second transparent conductive layer 22, and the metal layer 23 are stacked in the direction perpendicular to the base substrate 1, and the second transparent conductive layer 2 is located on the side of the metal layer 23 facing away from the first transparent conductive layer 21.

After forming the structure as shown in FIG. 5E, the manufacturing method of the display panel further comprises: sequentially forming the light-emitting layer 4 and the cathode electrode 8 by the same process as in FIG. 4I-FIG. 4J, please refer to the previous description. For example, the first transparent conductive material source 81 is used as the second transparent conductive material source 82, that is, the same transparent conductive material source is used as the vapor deposition source to form the first transparent conductive layer and the second transparent conductive layer, so as to simplify the process. For example, the first transparent conductive layer, the second transparent conductive layer, and the cathode are formed by using the first transparent conductive material source 81 to further simplify the process.

Other structural features and technical effects not mentioned are the same as those described in the embodiments of the light-emitting device, please refer to the previous description and will not be repeated here.

In the manufacturing method provided by the embodiments of the present disclosure, for example, the first transparent conductive layer, the metal layer, and the second transparent conductive layer are formed by two masks instead of the same mask, or the first transparent conductive layer, the metal layer, and the second transparent conductive layer are formed by three masks respectively. For example, the metal layer is formed by a patterning process by using a third mask, and the pattern of the third mask corresponds to the pattern of the metal layer. For example, the first transparent conductive layer is formed by a patterning process by using a fourth mask, and the pattern of the fourth mask corresponds to the pattern of the first transparent conductive layer. For example, the second transparent conductive layer is formed by a patterning process by using a third mask, and the pattern of the third mask corresponds to the pattern of the second transparent conductive layer; then, the metal layer is formed by a patterning process by using a fourth mask, and the pattern of the fourth mask corresponds to the pattern of the metal layer; and then the first transparent conductive layer is formed through a patterning process by using a fifth mask, the pattern of the fifth mask corresponds to the pattern of the first transparent conductive layer; the fourth mask and the fifth mask may be the same mask.

For example, the array substrate includes a silicon substrate, and the silicon substrate includes the above base substrate 1. The above embodiments of the manufacturing method of the display panel are described with the example of forming the light-emitting device on the base substrate 1. For example, as shown in FIG. 1B, the display panel has the light-emitting device formed on the first insulation layer 450; in this case, the specific manufacturing method is the same as the manufacturing method in the above embodiments, except that the base substrate 1 on which the light-emitting device is formed is replaced by the first insulation layer 450. Processes for forming other structures of the array substrate, such as processes for forming the drive transistor T1 and other transistors of the pixel circuit, processes for forming the via hole 452, etc., may be performed by those skilled in the art according to conventional techniques in the Art.

Features and technical effects not mentioned in the embodiments of the manufacturing method of the display panel are the same as those in the display panel as shown in FIG. 1B-FIG. 1D and FIG. 2B-FIG. 2C. Please refer to the previous descriptions, which are not repeated here.

The above are merely specific implementations of the present disclosure without limiting the protection scope of the present disclosure thereto. The protection scope of the present disclosure should be based on the protection scope of the appended claims.

What is claimed is:
1. A display panel, comprising:
a base substrate;
a plurality of pixels, located at a side of the base substrate, wherein at least one of the plurality of pixels comprises:
an anode electrode, comprising a first transparent conductive layer and a metal layer which are stacked, wherein the first transparent conductive layer is located on a side of the metal layer facing away from the base substrate, the first transparent conductive layer completely covers the metal layer, and an orthographic projection of the metal layer on the base substrate is located in an orthographic projection of the first transparent conductive layer on the base substrate; and
a light-emitting layer, stacked with the anode electrode and located on a side of the first transparent conductive layer facing away from the metal layer; and
a drive circuit, located between the base substrate and the anode electrode, wherein the drive circuit comprises a drive transistor and a storage capacitor, the drive transistor comprises a source electrode, a drain electrode, and a gate electrode, one of the source electrode and the drain electrode is electrically connected with the anode electrode, the gate electrode is electrically connected with the storage capacitor, and the storage capacitor is configured to store data signals, wherein
the anode electrode further comprises: a second transparent conductive layer, stacked with the first transparent conductive layer and the metal layer and located between the metal layer and the drive circuit,
the first transparent conductive layer and the second transparent conductive layer completely encapsulate the metal layer, and the orthographic projection of the metal layer on the base substrate is located in an orthographic projection of the second transparent conductive layer on the base substrate.

2. The display panel according to claim 1, wherein
the second transparent conductive layer comprises a first surface facing the base substrate, a second surface opposite to the first surface and located on a side of the first surface facing away from the base substrate, and a side surface intersecting with both the first surface and the second surface; and
the first transparent conductive layer covers the side surface of the second transparent conductive layer and a portion of the second surface of the second transparent conductive layer that is not covered by the metal layer.

3. The display panel according to claim 2, wherein the orthographic projection of the first transparent conductive layer on the base substrate completely coincides with the orthographic projection of the second transparent conductive layer on the base substrate.

4. The display panel according to claim 1, wherein
the base substrate comprises a main surface, the first transparent conductive layer and the metal layer are stacked on the main surface of the base substrate, and the first transparent conductive layer is located on a side of the metal layer facing away from the main surface of the base substrate;
the metal layer comprises a first surface facing the base substrate, a second surface opposite to the first surface and located on a side of the first surface facing away from the base substrate, and a side surface intersecting with both the first surface and the second surface; and
the first transparent conductive layer covers the second surface of the metal layer and the side surface of the metal layer.

5. The display panel according to claim 4, wherein
the first transparent conductive layer comprises a first surface facing the base substrate, a second surface opposite to the first surface and located on a side of the first surface facing away from the base substrate, and a side surface intersecting with the first surface and the second surface; and
an included angle between the side surface of the first transparent conductive layer and the main surface of the base substrate is smaller than an included angle between the side surface of the metal layer and the main surface of the base substrate.

6. The display panel according to claim 5, wherein the included angle between the side surface of the first transparent conductive layer and the main surface of the base substrate is ranged from 20 to 50 degrees, and the included angle between the side surface of the metal layer and the main surface of the base substrate is ranged from 30 to 60 degrees.

7. The display panel according to claim 5, further comprising:
a plurality of the anode electrodes spaced from each other, wherein the light-emitting layer is a continuous integral layer and covers the second surface of the first transparent electrode layer of each of the plurality of anode electrodes and the side surface of the first transparent electrode layer of each of the plurality of anode electrodes; and
a cathode electrode, located at a side of the light-emitting layer facing away from the plurality of anode electrodes.

8. The display panel according to claim 1, wherein a work function of the first transparent conductive layer is greater than a work function of the metal layer.

9. The display panel according to claim 8, wherein a work function of a material of the first transparent conductive layer is greater than 4.60 eV.

10. The display panel according to claim 1, wherein each of a material of the first transparent conductive layer and a material of the second transparent conductive layer includes at least one of indium tin oxide (ITO), indium zinc oxide (IZO) and aluminum-doped zinc oxide (AZO).

11. The display panel according to claim 1, wherein a reflectivity of the metal layer is greater than a reflectivity of the first transparent conductive layer.

12. The display panel according to claim 1, wherein a reflectivity of the metal layer is greater than or equal to 90%.

13. The display panel according to claim 1, wherein a material of the metal layer is silver.

14. The display panel according to claim 1, wherein a thickness of the metal layer is greater than a thickness of the first transparent conductive layer, and the thickness of the metal layer is greater than a thickness of the second transparent conductive layer.

15. The display panel according to claim 1, wherein the display panel is a Micro LED display panel or an OLED display panel.

16. The display panel according to claim 1, further comprising:
a light-reflecting layer, located between the base substrate and the anode electrode and electrically connected with the anode electrode.

17. The display panel according to claim 16, further comprising:
a first insulation layer, located between the anode electrode and the light-reflecting layer and comprising a first via hole, wherein the anode electrode is electrically connected with the light-reflecting layer through the first via hole.

18. The display panel according to claim 17, further comprising:
a second insulation layer, located between the light-reflecting layer and the source electrode and the drain electrode and comprising a second via hole, wherein the one of the source electrode and the drain electrode is electrically connected with the light-reflecting layer through the second via hole.

19. A display apparatus, comprising:
the display panel according to claim 1.

20. A display panel, comprising:
a base substrate;
a plurality of pixels, located at a side of the base substrate, wherein at least one of the plurality of pixels comprises:
an anode electrode, comprising a first transparent conductive layer and a metal layer which are stacked, wherein the first transparent conductive layer is located on a side of the metal layer facing away from the base substrate, the first transparent conductive layer completely covers the metal layer, and an orthographic projection of the metal layer on the base substrate is located in an orthographic projection of the first transparent conductive layer on the base substrate; and
a light-emitting layer, stacked with the anode electrode and located on a side of the first transparent conductive layer facing away from the metal layer; and a drive circuit, located between the base substrate and the anode electrode, wherein the drive circuit comprises a drive transistor and a storage capacitor, the drive transistor comprises a source electrode, a drain electrode, and a gate electrode, one of the source electrode and the drain electrode is electrically connected with the anode electrode, the gate electrode is electrically connected with the storage capacitor, and the storage capacitor is configured to store data signals, wherein the base substrate comprises a main surface, the first transparent conductive layer and the metal layer are stacked on the main surface of the base substrate, and the first transparent conductive layer is located on a side of the metal layer facing away from the main surface of the base substrate;

the metal layer comprises a first surface facing the base substrate, a second surface opposite to the first surface and located on a side of the first surface facing away from the base substrate, and a side surface intersecting with both the first surface and the second surface; and the first transparent conductive layer covers the second surface of the metal layer and the side surface of the metal layer.

\* \* \* \* \*